US010332950B2

United States Patent
Jeong et al.

(10) Patent No.: US 10,332,950 B2
(45) Date of Patent: Jun. 25, 2019

(54) ORGANIC LIGHT EMITTING DISPLAY DEVICE

(71) Applicant: SAMSUNG DISPLAY CO., LTD., Yongin-si, Gyeonggi-Do (KR)

(72) Inventors: Changyong Jeong, Yongin-si (KR); Heejun Kwak, Yongin-si (KR); Taewook Kang, Seongnam-si (KR); Mugyeom Kim, Hwaseong-si (KR); Jaeseob Lee, Seoul (KR); Jonghan Jeong, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 3 days.

(21) Appl. No.: 15/684,506

(22) Filed: Aug. 23, 2017

(65) Prior Publication Data

US 2018/0061914 A1 Mar. 1, 2018

(30) Foreign Application Priority Data

Aug. 24, 2016 (KR) .......................... 10-2016-0107960

(51) Int. Cl.
*H01L 27/32* (2006.01)

(52) U.S. Cl.
CPC ...... *H01L 27/3262* (2013.01); *H01L 27/3211* (2013.01); *H01L 27/3246* (2013.01); *H01L 27/3248* (2013.01); *H01L 2251/5338* (2013.01)

(58) Field of Classification Search
CPC ............. H01L 27/3246; H01L 27/3262; H01L 27/3211; H01L 27/3248; H01L 2251/5338
See application file for complete search history.

(56) References Cited

U.S. PATENT DOCUMENTS

| 8,455,876 | B2 | 6/2013 | Choi et al. |
| 9,129,927 | B2 | 9/2015 | Gupta et al. |
| 9,214,508 | B2 | 12/2015 | Cho et al. |
| 9,276,050 | B2 | 3/2016 | Kwon et al. |
| 9,385,175 | B2 | 7/2016 | Son et al. |
| 9,406,705 | B2 | 8/2016 | Kwon et al. |
| 2005/0127357 | A1* | 6/2005 | Wong ............... H01L 27/12 257/59 |

(Continued)

*Primary Examiner* — Matthew L Reames
*Assistant Examiner* — Benjamin T Liu
(74) *Attorney, Agent, or Firm* — F. Chau & Associates, LLC

(57) ABSTRACT

An organic light emitting display device includes a folding part configured to be folded, and a flat part adjacent to the folding part. The folding part includes a first pixel. The flat part includes a second pixel. The first pixel includes a first organic light emitting diode, a first driving transistor and a first control transistor. The first driving transistor includes a first semiconductor pattern. The first control transistor includes a second semiconductor pattern. The second pixel includes a second organic light emitting diode, a second driving transistor and second control transistor. The second driving transistor includes a third semiconductor pattern. The second control transistor includes a fourth semiconductor pattern. At least one of the first or second semiconductor patterns includes an oxide semiconductor or a polycrystalline silicon, and each of the third and fourth semiconductor patterns includes the other of the oxide semiconductor and the polycrystalline silicon.

18 Claims, 23 Drawing Sheets

(56) References Cited

U.S. PATENT DOCUMENTS

| | | | | |
|---|---|---|---|---|
| 2014/0183540 A1* | 7/2014 | Koyama | ............. | G09G 3/3225 |
| | | | | 257/72 |
| 2014/0361262 A1* | 12/2014 | Kim | .................. | H01L 27/3218 |
| | | | | 257/40 |
| 2016/0289560 A1* | 10/2016 | Ogawa | ............... | C09K 19/0403 |
| 2017/0062532 A1* | 3/2017 | Jeong | ................. | H01L 27/3246 |

* cited by examiner

ORGANIC LIGHT EMITTING DISPLAY DEVICE

CROSS-REFERENCE TO RELATED APPLICATION

This U.S. non-provisional patent application claims priority under 35 U.S.C. § 119 to Korean Patent Application No. 10-2016-0107960 filed on Aug. 24, 2016, the disclosure of which is incorporated by reference herein in its entirety.

TECHNICAL FIELD

The present inventive concept relates to an organic light emitting display device, and more particularly, to an organic light emitting display device including two or more transistors with different layer structures.

DISCUSSION OF THE RELATED ART

An organic light emitting display device includes a plurality of pixels. Each of the pixels includes an organic light emitting diode and a circuit unit for controlling the organic light emitting diode. The circuit unit may include a control transistor, a driving transistor, and a storage capacitor.

The organic light emitting diode includes an anode, a cathode, and an organic light emitting layer disposed between the anode and the cathode. The organic light emitting diode emits light when a voltage greater than a threshold voltage is applied to the organic light emitting layer.

Since the organic light emitting display device may be disposed on a flexible substrate, the organic light emitting display device may be bent. When the flexible substrate is subject to repeated folding and unfolding, parts of the organic light emitting display device may crack.

SUMMARY

According to an exemplary embodiment of the present inventive concept, an organic light emitting display device includes a folding part configured to be folded along a folding axis, wherein the folding part includes a first pixel, and a flat part adjacent to the folding part, wherein the flat part includes a second pixel. The first pixel includes a first organic light emitting diode, a first driving transistor and a first control transistor, wherein the first driving transistor is connected to the first organic light emitting diode and includes a first semiconductor pattern, and the first control transistor is connected to one of a plurality of scan lines and one of a plurality of data lines and includes a second semiconductor pattern. The second pixel includes a second organic light emitting diode, a second driving transistor and second control transistor, wherein the second driving transistor is connected to the second organic light emitting diode and includes a third semiconductor pattern, and the second control transistor is connected to one of the plurality of scan lines and one of the plurality of data lines and includes a fourth semiconductor pattern. At least one of the first or second semiconductor patterns includes an oxide semiconductor or a polycrystalline silicon, and each of the third and fourth semiconductor patterns includes the other of the oxide semiconductor and the polycrystalline silicon.

In an exemplary embodiment of the present inventive concept, each of the second semiconductor pattern, the third semiconductor pattern, and the fourth semiconductor pattern includes the polycrystalline silicon, and the first semiconductor pattern includes the oxide semiconductor.

In an exemplary embodiment of the present inventive concept, a length of a channel area of a first semiconductor pattern is shorter than a length of a channel area of each of the second, the third and the fourth semiconductor patterns.

In an exemplary embodiment of the present inventive concept, the first pixel is provided in plural and the second pixel is provided in plural, and the number of the first pixels is greater than the number of the second pixels.

In an exemplary embodiment of the present inventive concept, the first driving transistor further includes a control electrode disposed on the first semiconductor pattern, the first control transistor further includes a control electrode disposed on the second semiconductor pattern, the second driving transistor further includes a control electrode disposed on the third semiconductor pattern, and the second control transistor further includes a control electrode disposed on the fourth semiconductor pattern.

In an exemplary embodiment of the present inventive concept, the first driving transistor further includes a control electrode disposed below the first semiconductor pattern, the first control transistor further includes a control electrode disposed on the second semiconductor pattern, the second driving transistor further includes a control electrode disposed on the third semiconductor pattern, and the second control transistor further includes a control electrode disposed on the fourth semiconductor pattern.

In an exemplary embodiment of the present inventive concept, each of the first semiconductor pattern and the second semiconductor pattern includes the oxide semiconductor, and each of the third semiconductor pattern and the fourth semiconductor pattern includes the polycrystalline silicon.

In an exemplary embodiment of the present inventive concept, the first driving transistor further includes a control electrode disposed on the first semiconductor pattern, the first control transistor further includes a control electrode disposed on the second semiconductor pattern, the second driving transistor further includes a control electrode disposed on the third semiconductor pattern, and the second control transistor further includes a control electrode disposed on the fourth semiconductor pattern.

In an exemplary embodiment of the present inventive concept, the first driving transistor further includes a control electrode disposed below the first semiconductor pattern, the first control transistor further includes a control electrode disposed below the second semiconductor pattern, the second driving transistor further includes a control electrode disposed on the third semiconductor pattern, and the second control transistor further includes a control electrode disposed on the fourth semiconductor pattern.

In an exemplary embodiment of the present inventive concept, each of the first semiconductor pattern, the second semiconductor pattern, and the third semiconductor pattern includes the polycrystalline silicon, and the fourth semiconductor pattern includes the oxide semiconductor.

In an exemplary embodiment of the present inventive concept, the first semiconductor pattern is bendable in a direction perpendicular to the folding axis on a plane.

In an exemplary embodiment of the present inventive concept, the first semiconductor pattern includes first to third areas. The first area and the third area are spaced apart from each other in a direction parallel to the folding axis. The second area connects the first area and the third area and is a channel area, the second area has a length extending along the folding axis and protrudes away from the first area and the third area by a protrusion length in the direction perpendicular to the folding axis. A ratio of the length of the second area to the protrusion length is greater than or equal to 0.3 and less than or equal to 1.

In an exemplary embodiment of the present inventive concept, each of the first semiconductor pattern and the second semiconductor pattern includes the polycrystalline silicon, and each of the third semiconductor pattern and the fourth semiconductor pattern includes the oxide semiconductor.

In an exemplary embodiment of the present inventive concept, the first semiconductor pattern is bendable in a direction perpendicular to the folding axis on a plane.

In an exemplary embodiment of the present inventive concept, the first driving transistor further includes a control electrode disposed on the first semiconductor pattern, the first control transistor further includes a control electrode disposed on the second semiconductor pattern, the second driving transistor further includes a control electrode disposed on the third semiconductor pattern, and the second control transistor further includes a control electrode disposed on the fourth semiconductor pattern.

In an exemplary embodiment of the present inventive concept, the first driving transistor further includes a control electrode disposed on the first semiconductor pattern, the first control transistor further includes a control electrode disposed on the second semiconductor pattern, the second driving transistor further includes a control electrode disposed below the third semiconductor pattern, and the second control transistor further includes a control electrode disposed below the fourth semiconductor pattern.

In an exemplary embodiment of the present inventive concept, the first driving transistor further includes a control electrode disposed below the first semiconductor pattern, the first control transistor further includes a control electrode disposed below the second semiconductor pattern, and the second driving transistor further includes a control electrode disposed below the third semiconductor pattern.

According to an exemplary embodiment of the present inventive concept, an organic light emitting display device includes a folding part configured to be folded along a folding axis, wherein the folding part includes a first pixel, and a flat part adjacent to the folding part, wherein the flat part includes a second pixel. The first pixel includes a first organic light emitting diode, a folding driving transistor and a folding control transistor, wherein the folding driving transistor is connected to the first organic light emitting diode and includes a first semiconductor pattern, and the folding control transistor is connected to one of a plurality of scan lines and one of a plurality of data lines and includes a second semiconductor pattern. The second pixel includes a second organic light emitting diode, a flat driving transistor and flat control transistor, wherein the flat driving transistor is connected to the second organic light emitting diode and includes a third semiconductor pattern, and the flat control transistor is connected to one of the plurality of scan lines and one of the plurality of data lines and includes a fourth semiconductor pattern. The first semiconductor pattern includes an oxide semiconductor, and each of the third semiconductor pattern and the fourth semiconductor pattern includes a polycrystalline silicon.

According to an exemplary embodiment of the present inventive concept, an organic light emitting display device includes a folding part configured to be folded along a folding axis, wherein the folding part includes a first pixel, and a flat part adjacent to the folding part, wherein the flat part includes a second pixel. The first pixel includes a first organic light emitting diode, a folding driving transistor and a folding control transistor, wherein the folding driving transistor is connected to the first organic light emitting diode and includes a first semiconductor pattern, and the folding control transistor is connected to one of a plurality of scan lines and one of a plurality of data lines and includes a second semiconductor pattern. The second pixel includes a second organic light emitting diode, a flat driving transistor and flat control transistor, wherein the flat driving transistor is connected to the second organic light emitting diode and includes a third semiconductor pattern, and the flat control transistor is connected to one of the plurality of scan lines and one of the plurality of data lines and includes a fourth semiconductor pattern. The fourth semiconductor pattern includes an oxide semiconductor, and each of the first semiconductor pattern and the second semiconductor pattern includes a polycrystalline silicon.

In an exemplary embodiment of the present inventive concept, the first semiconductor pattern is bendable in a direction perpendicular to the folding axis on a plane.

According to an exemplary embodiment of the present inventive concept, an organic light emitting display device includes a first part configured to be folded along a folding axis, wherein the first part includes a first pixel, and a second part adjacent to the first part, wherein the second part includes a second pixel. The first pixel includes a first organic light emitting diode, a first driving transistor and a first control transistor. The first driving transistor is connected to the first organic light emitting diode and includes a first semiconductor pattern and a first control electrode disposed above the first semiconductor pattern. The first control transistor is connected to one of a plurality of scan lines and one of a plurality of data lines and includes a second semiconductor pattern and a second control electrode disposed above the second semiconductor pattern. The second pixel includes a second organic light emitting diode, a second driving transistor and a second control transistor. The second driving transistor is connected to the second organic light emitting diode and includes a third semiconductor pattern and a third control electrode disposed above the third semiconductor pattern. The second control transistor is connected to one of the plurality of scan lines and one of the plurality of data lines and includes a fourth semiconductor pattern and a fourth control electrode disposed below the fourth semiconductor pattern.

In an exemplary embodiment of the present inventive concept, the second semiconductor pattern includes an oxide semiconductor, and each of the first semiconductor pattern, the third semiconductor pattern and the fourth semiconductor pattern includes a polycrystalline silicon.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Exemplary embodiments of the present inventive concept will be described more fully hereinafter with reference to the accompanying drawings. It is to be understood that the present inventive concept may, however, be embodied in different forms and thus should not be construed as being limited to the exemplary embodiments set forth herein.

Figure 1:
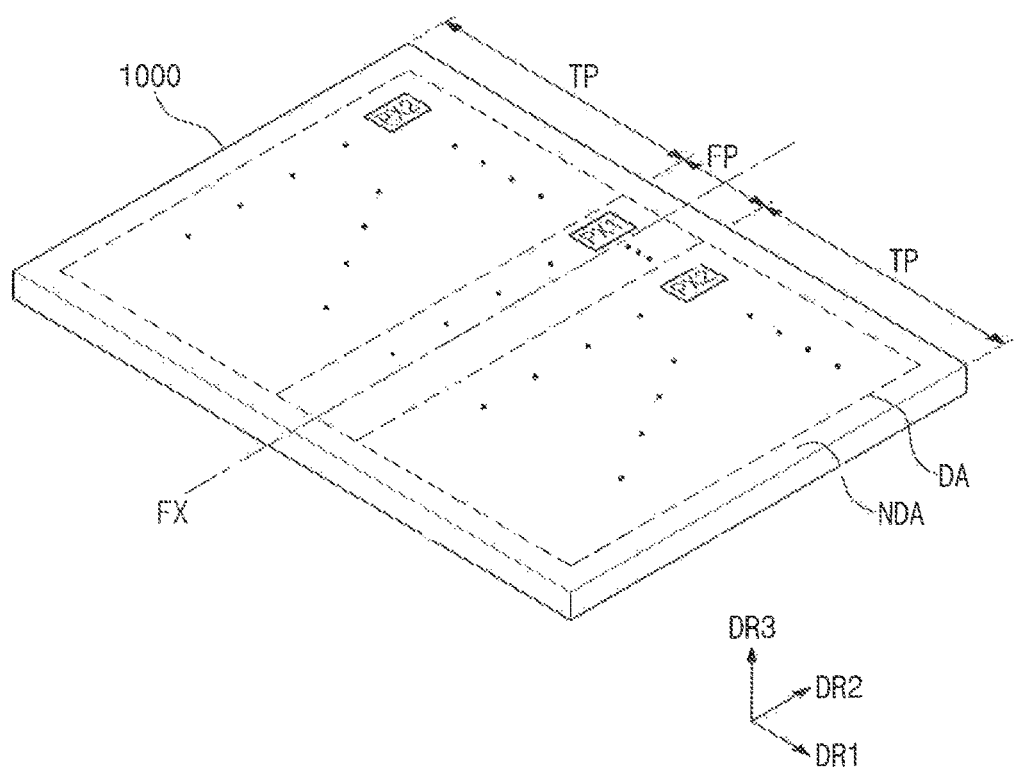
FIG. 1 is a perspective view illustrating an organic light emitting display device in a folded state according to an exemplary embodiment of the present inventive concept.
Figure 2:
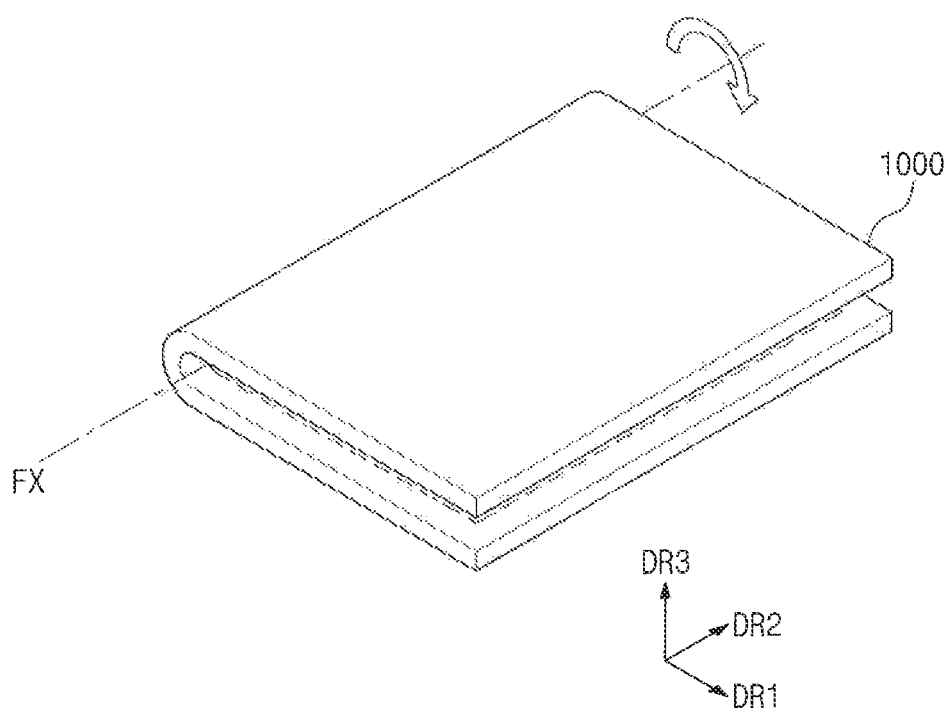
FIG. 2 is a perspective view illustrating an organic light emitting display device in a folded state according to an exemplary embodiment of the present inventive concept.

FIGS. 1 and 2 are perspective views of an organic light emitting display device according to an exemplary embodiment of the present inventive concept.

FIG. 1 shows an organic light emitting display 1000 in an unfolded state, and FIG. 2 shows the organic light emitting display 1000 in a folded state.

The organic light emitting display 1000 may be folded along a folding axis FX. The organic light emitting display 1000 may include a folding part FP and a flat part TP. The folding part FP may be folded along the folding axis FX. The flat part TP is connected to the folding part FP and maintains a flat shape while in a folding state.

According to an exemplary embodiment of the present inventive concept, when the organic light emitting display 1000 is in an unfolded state, the folding part FP and the flat part TP may be adjacent to each other in a first direction DR1. For example, the folding part FP and the flat part TP extend along the first direction DR1 and a second direction DR2 perpendicular to the first direction DR1. The folding axis FX may extend in the second direction DR2. A third direction DR3 may be the thickness direction of the organic light emitting display 1000.

A display area DA and a non-display area NA may be provided in the organic light emitting display 1000. The non-display area NA is adjacent to the display area DA and does not display an image. The non-display area NA may be disposed on at least one side of the display area DA. For example, the non-display area NA may surround the display area DA.

A plurality of pixels may be arranged in the display area DA. A first pixel PX1 may be disposed in the folding part FP and a second pixel PX2 may be disposed in the flat part TP. For example, there may be a plurality of the first pixels PX1 in the folding part FP and a plurality of the second pixels PX2 in the flat part TP. Each of the first pixels PX1 and the second pixels PX2 may display one color such as red, green, blue, and white. The plurality of first pixels PX1 and the plurality of second pixels PX2 may be arranged in a matrix. The operation of the first pixel PX1 and the second pixel PX2 are substantially the same but each of the pixels may have different structures from each other. Details of this structure difference will be described later.

Figure 3:
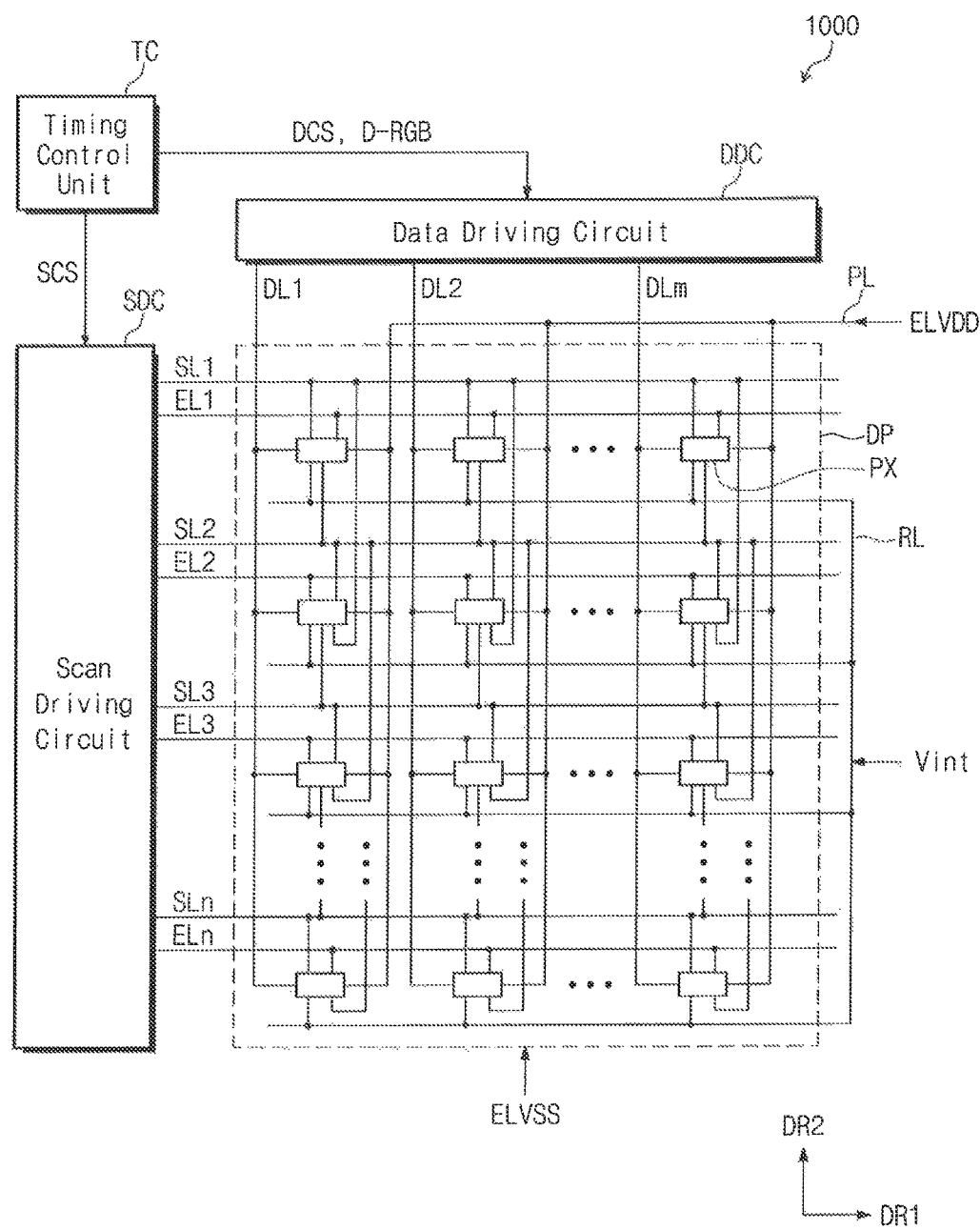
FIG. 3 is a block diagram of an organic light emitting display device according to an exemplary embodiment of the present inventive concept.

FIG. 3 is a block diagram of an organic light emitting display device according to an exemplary embodiment of the present inventive concept.

The organic light emitting display device includes a timing control unit TC, a scan driving circuit SDC, a data driving circuit DDC, and a display panel DP. The display panel DP displays an image according to an electrical signal.

In the present embodiment, the display panel DP is, for example, an organic light emitting display panel. It is to be understood, however, that is merely an example, and thus, the display panel DP may include various other kinds of display panels.

The timing controller TC receives input image signals (e.g., from an external device) and generates image data D-RGB by converting a data format of the input image signals to match the interface specifications of the scan driving circuit SDC. The timing controller TC outputs the image data D-RGB and various control signals DCS and SCS.

The scan driving circuit SDC receives a scan control signal SCS from the timing controller TC. The scan control signal SCS may include a vertical start signal for controlling an operation of the scan driving circuit SDC and a clock signal for determining the output timings of signals from the scan driving circuit SDC.

The scan driving circuit SDC generates a plurality of scan signals and sequentially outputs the plurality of scan signals to a plurality of scan lines SL1 to SLn. Additionally, the scan driving circuit SDC generates a plurality of light emitting control signals in response to the scan control signal SCS and outputs the plurality of light emitting control signals to a plurality of light emitting lines EL1 to ELn.

Although it is shown in FIG. 3 that scan signals and light emitting control signals are outputted from one scan driving circuit SDC, the present inventive concept is not limited thereto. According to an exemplary embodiment of the present inventive concept, a plurality of scan driving circuits SDC may divide and output scan signals, and also divide and output light emitting control signals. Additionally, according to an exemplary embodiment of the present inventive concept, a driving circuit for generating and outputting scan signals and a driving circuit for generating and outputting light emitting control signals may be separately provided.

The data driving circuit DDC receives the data control signal DCS and the image data D-RGB from the timing control unit TC. The data driving circuit DDC converts the image data D-RGB into data signals and outputs the data signals to data lines DL1 to DLm. The data signals are analog voltages corresponding to grayscale values of the image data D-RGB.

The display panel DP includes scan lines SL1 to SLn, light emitting lines EL1 to ELn, data lines DL1 to DLm, and pixels PX. The scan lines SL to SLn extend in a first direction DR1 and are arranged in a second direction DR2 orthogonal to the first direction DR1.

Each of the plurality of light emitting lines EL1 to ELn may be arranged parallel to a corresponding scan line among the scan lines SL1 to SLn. The data lines DL1 to DLm intersect the scan lines SL1 to SLn. The data lines DL1 to DLm and scan lines SL1 to SLn are insulated from each other.

Each of the plurality of pixels PX connects to a corresponding scan line among the scan lines SL1 to SLn, a corresponding light emitting line among the light emitting lines EL1 to ELn, and a corresponding data line among the data lines DL1 to DLm.

Each of the pixels PX receives a first voltage ELVDD and a second voltage ELVSS lower than the first voltage ELVDD. The first voltage ELVDD may correspond to the above-mentioned power voltage ELVDD (see FIG. 1). Each of the pixels PX connects to a power line PL where the first voltage ELVDD is applied. Each of the pixels PX connects to an initialization line RL for receiving an initialization voltage Vint.

Each of the plurality of pixels PX may be electrically connected to three scan lines. As shown in FIG. 1, the pixels PX of the second pixel row may be connected to the first to third scan lines SL1 to SL3.

Each of the plurality of pixels PX may be referred to as the first pixel PX1 (see FIG. 1) or the second pixel PX2 (see FIG. 2) depending on the position of each pixel PX. The operation of the first pixel PX1 and the second pixel PX2 are substantially the same but they may have different structures.

The display panel DP may further include a plurality of dummy scan lines. The display panel DP may further include a dummy scan line connected to the pixels PX of the first pixel row and a dummy scan line connected to the pixels PX of the nth pixel row. Additionally, pixels PX (hereinafter referred to as the pixels of a pixel column) connected to one data line among the data lines DL1 to DLm may be connected to each other. Two adjacent pixels PX among the pixels PX of a pixel column may be electrically connected to each other.

Each of the plurality of pixels PX includes an organic light emitting diode and a pixel driving circuit for controlling the light emission of the organic light emitting diode. The pixel driving circuit may include a plurality of thin film transistors and a capacitor. At least one of the scan driving circuit SDC and the data driving circuit DDC may include a thin film transistor formed through the same process as that of the pixel driving circuit.

The scan lines SL1 to SLn, the light emitting lines EL1 to ELn, the data lines DL1 to DLm, the power line PL, the initialization line RL, the pixels PX, the scan driving circuit SDC, and the data driving circuit DDC may be formed on a base substrate in a multi-step photolithography process. For example, in a plurality of steps including a deposition process or a coating process, insulation layers may be formed on the base substrate. Each of the insulation layers may be a thin film for covering the entire display panel DP or include at least one insulation pattern overlapping a certain configuration of the display panel DP. The insulation layers include an organic layer and/or an inorganic layer. In addition, a sealing layer for protecting the pixels PX may be further formed on the base substrate.

Figure 4:
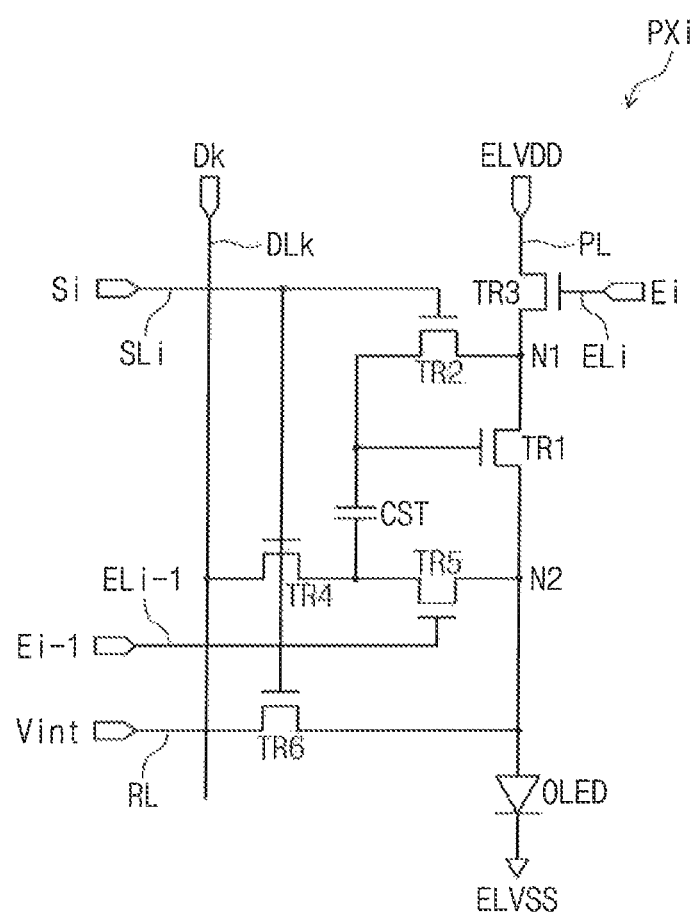
FIG. 4 is an equivalent circuit diagram of a pixel according to an exemplary embodiment of the present inventive concept.

FIG. 4 is an equivalent circuit diagram of a pixel PX according to an exemplary embodiment of the present inventive concept. FIG. 4 shows an equivalent circuit diagram corresponding to the ith pixel PXi connected to the kth data line DLk among the data lines DL1 to DLm, for example.

The ith pixel PXi includes an organic light emitting diode OLED and a pixel driving circuit for controlling the organic light emitting diode OLED. A pixel driving circuit may include six thin film transistors T1 to T6 and one capacitor CST. Moreover, the pixel driving circuit shown in FIG. 4 is just one example and its configuration may be variously modified.

The pixel driving circuit may include a driving transistor and a control transistor. The driving transistor controls a driving current supplied to the organic light emitting diode OLED. According to an exemplary embodiment of the present inventive concept, the driving transistor may be a first transistor TR1.

An output electrode of the first transistor TR1 is electrically connected to the organic light emitting diode OLED.

The output electrode of the first transistor TR1 may directly contact the anode of the organic light emitting diode OLED or may be connected to it through another transistor.

A control electrode of a control transistor may receive a control signal. A control signal applied to the ith pixel PXi may include the ith scan signal Si, a data signal Dk, an i-1th light emitting control signal Ei-1, and an ith light emitting control signal Ei.

According to an exemplary embodiment of the present inventive concept, the control transistor may include the second to sixth transistors TR2 to TR6. However, the control transistor is not limited thereto. For example, the control transistor may include less than or more than five thin film transistors.

A node between an output electrode of the second transistor TR2 and an input electrode of the first transistor TR1 is a first node N1. A node between an output electrode of the fifth transistor TR5 and an output electrode of the first transistor TR1 is a second node N2.

The first transistor TR1 receives a power voltage ELVDD through the third transistor TR3, and includes an input electrode connected to the first node N1, a control electrode connected to a first electrode of the capacitor CST, and an output electrode connected to the organic light emitting diode OLED through the second node N2.

The second transistor TR2 includes a control electrode connected to the ith scan line SLi, an input electrode, and an output electrode connected to the first node N1. The input electrode of the second transistor TR2 is connected to the control electrode of the first transistor TR1 and the first electrode of the capacitor CST.

The third transistor TR3 includes a control electrode connected to the ith light emitting control line ELi, an input electrode connected to a power line PL, and an output electrode connected to the first node N1. The third transistor TR3 is turned on in response to the ith light emitting control signal Ei.

The fourth transistor TR4 includes a control electrode connected to the ith scan line SLi, an input electrode connected to the kth data line DLk, and an output electrode. The output electrode of the fourth transistor TR4 is connected to a second electrode of the capacitor CST and the fifth transistor TR5. The fourth transistor TR4 is turned on in response to the ith scan signal Si, and provides a data signal, which is received through the input electrode, to the capacitor CST.

The fifth transistor TR5 includes a control electrode connected to the i-1th light emitting control line Ei-1, an input electrode, and an output electrode connected to the second node N2. The output electrode of the fifth transistor TR5 is connected to the second electrode of the capacitor CST and the output electrode of the fourth transistor TR4. The fifth transistor TR5 is turned on in response to the i-1th light emitting control signal Ei-1.

The sixth transistor TR6 includes a control electrode connected to the ith scan line SLi, an input electrode connected to an initialization line RL, and an output electrode connected to the organic light emitting diode OLED. The sixth transistor TR6 is turned on in response to the ith scan signal Si, and provides an initialization voltage Vint to the second node N2.

Each of the first to sixth transistors TR1 to TR6 may be a P-type transistor or an N-type transistor. An organic light emitting display device according to an exemplary embodiment of the present inventive concept is not limited thereto and may include various forms of transistors.

Hereinafter, an organic light emitting display device according to an exemplary embodiment of the present inventive concept is described with reference to FIGS. 5A and 5B.

Figure 5A:
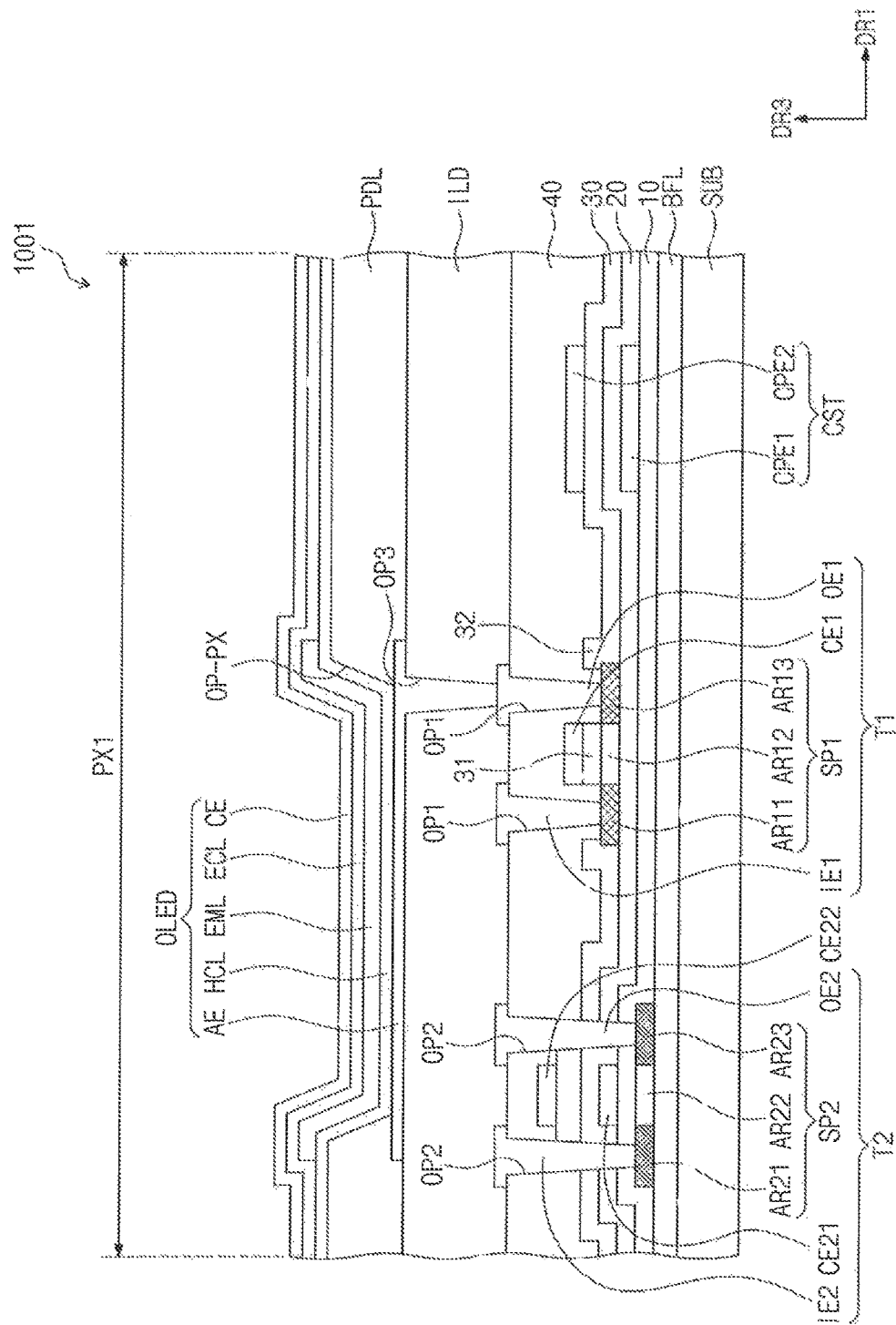
FIG. 5A is a partial cross-sectional view of an organic light emitting display device corresponding to a first pixel of FIG. 1 according to an exemplary embodiment of the present inventive concept.

FIG. 5A is a partial cross-sectional view of an organic light emitting display device 1001 corresponding to the first pixel PX1 of FIG. 1 according to an exemplary embodiment of the present inventive concept.

The organic light emitting display device 1001 includes a base substrate SUB, a capacitor CST, and an organic light emitting diode OLED. The first pixel PX1 includes a folding driving transistor T1 and a folding control transistor 2.

The folding driving transistor T1 may correspond to the first transistor TR1 shown in FIG. 4. The folding control transistor T2 may correspond to any one of the second to sixth transistors TR2 to TR6 shown in FIG. 4.

The folding driving transistor T1, the folding control transistor T2, the capacitor CST, and the organic light emitting diode OLED are arranged on the base substrate SUB.

The folding driving transistor T1 includes a first input electrode IE1, a first output electrode OE1, a first control electrode CE1, and a first semiconductor pattern SP1. The folding driving transistor T1 may be a driving transistor connected to the organic light emitting diode OLED of the first pixel PX1. The folding control transistor T2 includes a second input electrode IE2, a second output electrode OE2, a first sub control electrode CE21, and a second semiconductor pattern SP2. The folding control transistor T2 may be a control transistor for turning on the second pixel PX2. The first pixel PX1 may further include an auxiliary electrode CE22.

The capacitor CST includes a first capacitor electrode CPE1 and a second capacitor electrode CPE2 overlapping each other. The first capacitor electrode CPE1 and the second capacitor electrode CPE2 are disposed on the base substrate SUB and spaced apart from each other with a predetermined insulation layer disposed therebetween.

The organic light emitting device OLED includes a lower electrode AE, a first charge control layer HCL, a light emitting layer EML, a second charge control layer ECL, and an upper electrode CE. In this embodiment, the lower electrode AE, the first charge control layer HCL, the light emitting layer EML, the second charge control layer ECL, and the upper electrode CE may respectively correspond to an anode electrode AE, a hole control layer HCL, a light emitting layer EML, an electron control layer ECL, and a cathode electrode CE. However, the present inventive concept is not limited thereto, and the lower electrode AE, the first charge control layer HCL, the light emitting layer EML, the second charge control layer ECL, and the upper electrode CE may correspond to a cathode electrode, an electron control layer, a light emitting layer, a hole control layer, and an anode electrode, respectively.

The base substrate SUB may be a layer, a film, or a plate, where the folding driving transistor T1, the folding control transistor T2, and the capacitor CST are disposed. The base substrate 110 may include, for example, a plastic substrate, a glass substrate, and a metallic substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin.

A buffer layer BFL may be disposed between the upper surface of the base substrate SUB and the folding driving transistor T1 and the folding control transistor T2. The buffer layer BFL may increase the coupling strength of the base substrate SUB and conductive patterns or semiconductor patterns. The buffer layer BFL may include one of an organic material and/or an inorganic material. A barrier layer, for preventing foreign material or other impurities from entering, may be disposed at the upper surface of the base substrate SUB. The buffer layer BFL and the barrier layer may be selectively disposed/omitted.

The second semiconductor pattern SP2 is disposed on the buffer layer BFL. The second semiconductor pattern SP2 may include a crystalline semiconductor material. For example, the second semiconductor pattern SP2 may include a polycrystalline semiconductor material such as polycrystalline silicon.

The second semiconductor pattern SP2 may be divided into a first area AR21 and a third area AR23 including an impurity, and a second area AR22 disposed between the first area AR21 and the third area AR23. The impurity may be a dopant. The first area AR21 is connected to the second input electrode IE2 and the third area AR23 is connected to the second output electrode OE2.

The second area AR22 may be disposed between the first area AR21 and the third area AR23 and overlap the first sub control electrode CE21 on a plane. The second area AR22 may be a channel area of the folding control transistor T2. The second area AR22 might not be doped with an impurity.

The channel area of the folding control transistor T2 may include a polycrystalline semiconductor material. Accordingly, the folding control transistor T2 may have increased mobility and this function as a driving element with a high reliability.

A first insulation layer 10 is disposed on the second semiconductor pattern SP2. The first insulation layer 10 may include at least one of an inorganic material and/or an organic material. For example, the first insulation layer 10 may include a silicon nitride and/or a silicon oxide.

The first insulation layer 10 may be disposed on the buffer layer BFL to cover at least a portion of the second semiconductor pattern SP2. However, the present inventive concept is not limited thereto, and the first insulation layer 10 may be an insulation pattern overlapping the second area AR22 on a plane. The first insulation layer 10, according to an exemplary embodiment of the present inventive concept, may have various forms and is not limited to any one embodiment described herein.

The first sub control electrode CE21 and the first capacitor electrode CPE1 are disposed on the first insulation layer 10. For example, the first sub control electrode CE21 and the first capacitor electrode CPE1 may be disposed on the same layer.

The first sub control electrode CE21 overlaps the second area AR12. The first sub control electrode CE21 may have substantially the same shape as the second area AR22 on a plane.

A second insulation layer 20 is disposed on the first sub control electrode CE21 and the first capacitor electrode CPE1. The second insulation layer 20 is disposed on the first insulation layer 10 to cover the first sub control electrode CE21 and the first capacitor electrode CPE1. The second insulation layer 20 may include an organic material and/or an inorganic material. Moreover, in a display device according to an exemplary embodiment of the present inventive concept, the second insulation layer 20 may be omitted.

A first semiconductor pattern SP1 is disposed on the second insulation layer 20. The first semiconductor pattern SP1 may include an oxide semiconductor. For example, the oxide semiconductor may include a metal oxide of Zinc (Zn), Indium (In), Gallium (Ga), Tin (Sn), and Titanium (Ti) or a compound of a metal of Zn, In, Ga, Sn, and Ti and an oxide thereof.

Moreover, the first semiconductor pattern SP1 may include a crystallized oxide semiconductor. The crystallization of the oxide semiconductor may have an orientation in a vertical direction.

The first semiconductor pattern SP1 may be divided into a first area AR11 including an impurity, a third area AR13 including an impurity, and a second area AR12 adjacent to the first area AR11 and the third area AR13. The first area AR11 and the third area AR13 are spaced from each other with the second area AR12 therebetween.

The second area AR12 may be a channel area of the folding driving transistor T1. In relation to the first semiconductor pattern SP1, the impurity may be reduced metal materials. The first area AR11 and the third area AR13 may include metal materials reduced from a metal oxide that constitutes the second area AR12. Accordingly, the folding driving transistor T1 may lower leakage current, and thus, function as a switching element with increased on-off characteristics.

A third insulation layer 30 is disposed on the second insulation layer 20. The third insulation layer 30 includes an inorganic material and/or an organic material. The third insulation layer 30 overlaps the first sub control electrode CE21 and the first capacitor electrode CPE1 and exposes at least a portion of the first semiconductor pattern SP1. The third insulation layer 30 may be patterned to include a first insulation pattern 31 for covering the second area AR12 of the first semiconductor pattern SP1 and a second insulation pattern 32 for exposing at least a portion of the first area AR11 and the third area AR13. Between first insulation pattern 31 and the second insulation pattern 32 opening parts may be provided for exposing each of the first area AR11 and the third area AR13 of the first semiconductor pattern SP1.

The first control electrode CE1, the auxiliary electrode CE22, and the second capacitor electrode CPE2 are disposed on the third insulation layer 30. The first control electrode CE1 is disposed on the first insulation pattern 31. Moreover, the scan lines SL1 to SLn may be disposed on the same layer as the first control electrode CE1.

The second capacitor electrode CPE2 is disposed to overlap the first capacitor electrode CPE1. The capacitor CST forms an electric field in the second insulation layer 20 and the third insulation layer 30 disposed between the second capacitor electrode CPE2 and the first capacitor electrode CPE1.

The first control electrode CE1, the auxiliary electrode CE22, and the second capacitor electrode CPE2 may be disposed on the same layer. In addition, the first control electrode CE1, the auxiliary electrode CE22, and the second capacitor electrode CPE2 may include the same material. In the organic light emitting display device 1001 according to an exemplary embodiment of the present inventive concept, the first control electrode CE1, the auxiliary electrode CE22, and the second capacitor electrode CPE2 may be formed at the same time under the same process by disposing the first control electrode CE1, the auxiliary electrode CE22, and the second capacitor electrode (CPE2) on the same layer. The auxiliary electrode CE22 is disposed to overlap the first sub control electrode CE21. The auxiliary electrode CE22 may form a capacitor together with the first sub control electrode CE21 and may be connected in parallel to the capacitor CST. A fourth insulation layer 40 is disposed on the first control electrode CE1, the auxiliary electrode CE22, and the second capacitor electrode CPE2. The fourth insulation layer 40 includes an inorganic material and/or an organic material.

The first input electrode IE1, the first output electrode OE1, the second input electrode IE2, and the second output electrode OE2 are disposed on the fourth insulation layer 40. Each of the first input electrode IE1, the first output electrode OE1, the second input electrode IE2, and the second output electrode OE2 may penetrate at least a portion of the first to fourth insulation layers 10, 20, 30, and 40 to be connected to the first semiconductor pattern SP1 or the second semiconductor pattern SP2.

For example, first input electrode IE1 and the first output electrode OE1 are connected to the first area AR11 and the third area AR13 of the first semiconductor pattern SP1, respectively, through first through holes OP1 penetrating the fourth insulation layer 40. The second input electrode IE2 and the second output electrode OE2 are connected to the first area AR21 and the third area AR23 of the second semiconductor pattern SP2, respectively, through second through holes OP2 penetrating the first to fourth insulation layers 10, 20, 30, and 40. Moreover, the data lines DL1 to DLm may be disposed on the same layer as the second input electrode IE2 and the second output electrode OE2. Accordingly, the data lines DL1 to DLm may be directly disposed on the upper surface of the fourth insulation layer 40.

An interlayer ILD is disposed on the fourth insulation layer 40. The interlayer ILD includes an inorganic material and/or an organic material. A third through hole OP3 penetrating the interlayer ILD may be provided in the interlayer ILD. The third through hole OP3 may be provided in an area overlapping the first output electrode OE1. For example, the third through hole OP3 may expose the third area AR23 of the second semiconductor pattern SP2.

A lower electrode AE is disposed on the interlayer ILD. The lower electrode AE is connected to the first output electrode OE1 of the folding driving transistor T1 through the third through hole OP3. A connection part of the first output electrode OE1 and the lower electrode AE may correspond to the second node N2 shown in FIG. 4.

A pixel definition layer PDL is disposed on the interlayer ILD. The pixel definition layer PDL may include an inorganic layer and/or an organic layer. An opening part OP-PX is provided in the pixel definition layer PDL. The opening part OP-PX exposes at least a portion of the lower electrode AE.

The first charge control layer HCL, the light emitting layer EML, the second charge control layer ECL, and the upper electrode CE are sequentially stacked on the lower electrode AE. The light emitting layer EML may be a light emitting pattern disposed in the opening part OP-PX. The organic light emitting diode OLED generates light from the light emitting layer EML by using a voltage difference between the lower electrode AE and the upper electrode CE.

A display device according to an exemplary embodiment of the present inventive concept may further include an organic layer and/or an inorganic layer disposed on the lower electrode CE.

Figure 5B:
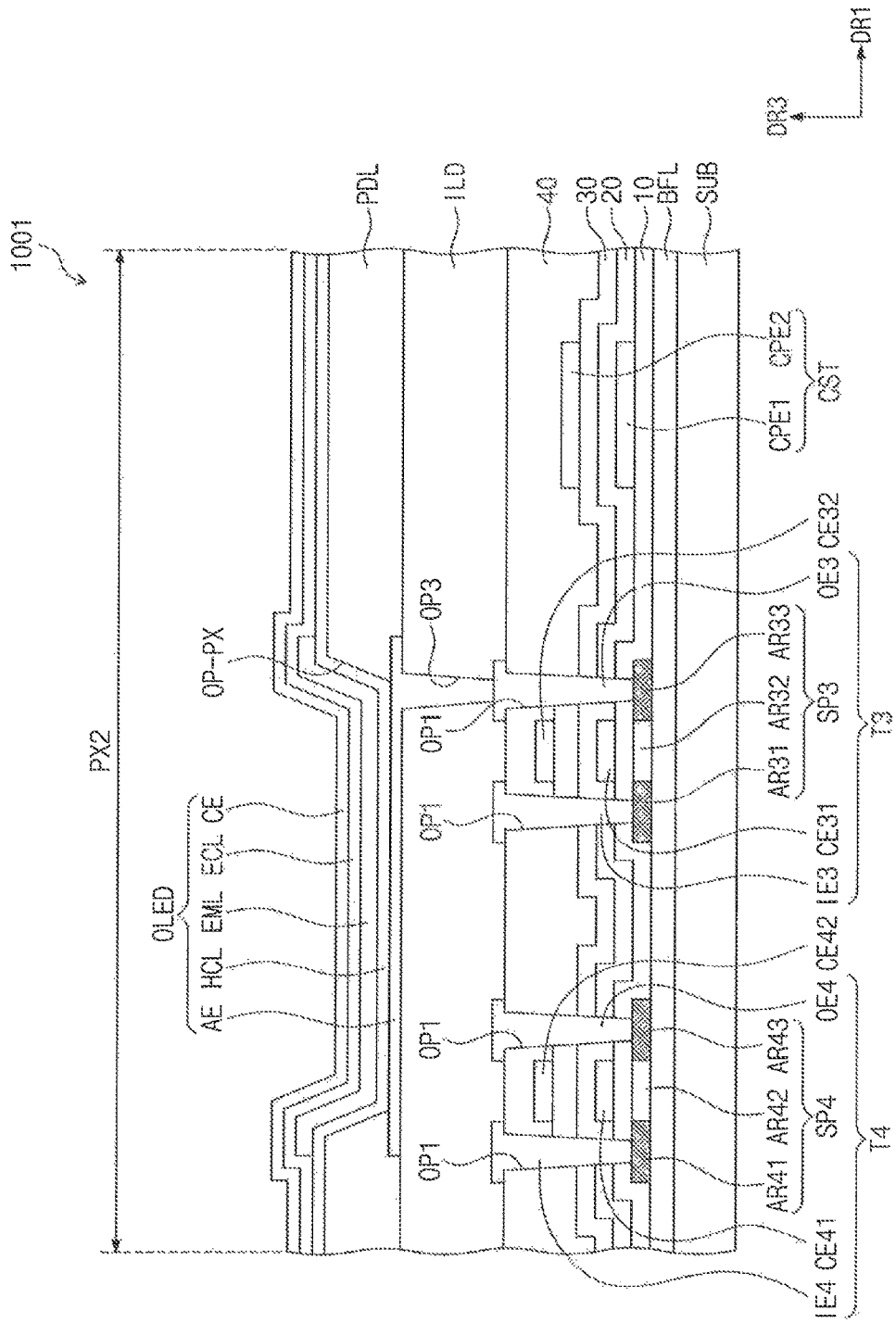
FIG. 5B is a partial cross-sectional view of an organic light emitting display device corresponding to a second pixel of FIG. 1 according to an exemplary embodiment of the present inventive concept.

FIG. 5B is a partial cross-sectional view of an organic light emitting display device 1001 corresponding to the second pixel PX2 of FIG. 1 according to an exemplary embodiment of the present inventive concept.

The second pixel PX2 includes a flat driving transistor T3 and a flat control transistor T4.

The flat driving transistor T3 may correspond to the first transistor TR1 shown in FIG. 4. In addition, the flat control transistor T4 may correspond to any one of the second to sixth transistors TR2 to TR6 shown in FIG. 4.

The flat driving transistor T3 includes a first input electrode IE3, a first output electrode OE3, a first sub control electrode CE31 and a third semiconductor pattern SP3. The flat driving transistor T3 may be a driving transistor connected to the organic light emitting diode OLED of the second pixel PX2. The flat control transistor T4 includes a second input electrode IE4, a second output electrode OE4, a first sub control electrode CE41, and a fourth semiconductor pattern SP4. The flat control transistor T4 may be a control transistor for turning on the second pixel PX2. The second pixel PX2 may further include auxiliary electrodes CE32 and CE42.

The auxiliary electrode CE32 is disposed to overlap the first sub control electrode CE31 of the flat driving transistor T3. The auxiliary electrode CE32 may form a capacitor together with the first sub control electrode CE31 and may be connected in parallel to the capacitor CST. The auxiliary electrode CE42 is disposed to overlap the first sub control electrode CE41 of the flat control transistor T4. The auxiliary electrode CE42 may form a capacitor together with the first sub control electrode CE41 and may be connected in parallel to the capacitor CST.

The third semiconductor pattern SP3 may be divided into a first area AR31 including an impurity, a third area AR33 including an impurity, and a second area AR32 disposed between the first area AR31 and the third area AR33.

The fourth semiconductor pattern SP4 may be divided into a first area AR41 including an impurity, a third area AR43 including an impurity, and a second area AR42 disposed between the first area AR41 and the third area AR43.

The configurations of the folding control transistor T2 shown in FIG. 5A, the flat driving transistor 13 shown in FIG. 5B, and the flat control transistor T4 shown in FIG. 5B may have substantially the same structure.

Thus, each of the third semiconductor pattern SP3 and the fourth semiconductor pattern SP4 may include a polycrystalline semiconductor material such as polycrystalline silicon.

According to an exemplary embodiment of the present inventive concept described with reference to FIGS. 5A and 5B, the first semiconductor pattern SP1 may include, for example, an oxide semiconductor, and the second to fourth semiconductor patterns SP2 to SP4 may include, for example, polycrystalline silicon.

A transistor where a channel area has an oxide semiconductor has less leakage current and a smaller Short Range Uniformity (SRU) compared to a transistor formed of a polycrystalline silicon. In this case, the transistor may be designed to have a smaller size compared to a transistor formed of a polycrystalline silicon with the same performance. In an exemplary embodiment of the present inventive concept, a channel length (e.g., the length of the second area AR12) of the first semiconductor pattern SP1 may be shorter than each of the channel lengths (e.g., the lengths of the second areas AR22, AR32, and AR42) of the second to fourth semiconductor patterns SP2 to SP4.

In an exemplary embodiment of the present inventive concept, the size of the folding driving transistor T1 may be smaller than the size of each of the flat driving transistor T3 and the flat control transistor T4. The number of the first pixels PX1 per unit area disposed in the folding part FP may be larger than the number of the second pixels PX2 per unit area disposed in the flat part TP.

In addition, if the size of a transistor is small, stress on the transistor due to bending may be relatively small. Therefore, since the first semiconductor pattern SP1 of the folding driving transistor T1 of the first pixel PX1 includes an oxide semiconductor, it the organic light emitting display device 1001 can be used to prevent the degradation and cracking of an element disposed in the folding part FP due to the bending of the organic light emitting display device 1001.

Further, when a size of a channel area of a transistor including a channel area with an oxide semiconductor is substantially the same size as that of a transistor including a channel area with a polycrystalline silicon, the transistor including the channel area with a polycrystalline silicon has a higher durability against bending stress compared to the transistor including the channel area with an oxide semiconductor.

In the organic light emitting display device 1001 according to the exemplary embodiment of the present inventive concept described with reference to FIGS. 5A and 5B, since the second semiconductor pattern SP2 of the folding control transistor T2 has polycrystalline silicon and has a larger channel length compared to the first semiconductor pattern SP1, the degradation and cracking of an element disposed in the folding part FP due to the bending of the organic light emitting display device 1001 may be prevented.

Hereinafter, an organic light emitting display device 1002 according to an exemplary embodiment of the present inventive concept is described with reference to FIGS. 6A and 6B.

Figure 6A:
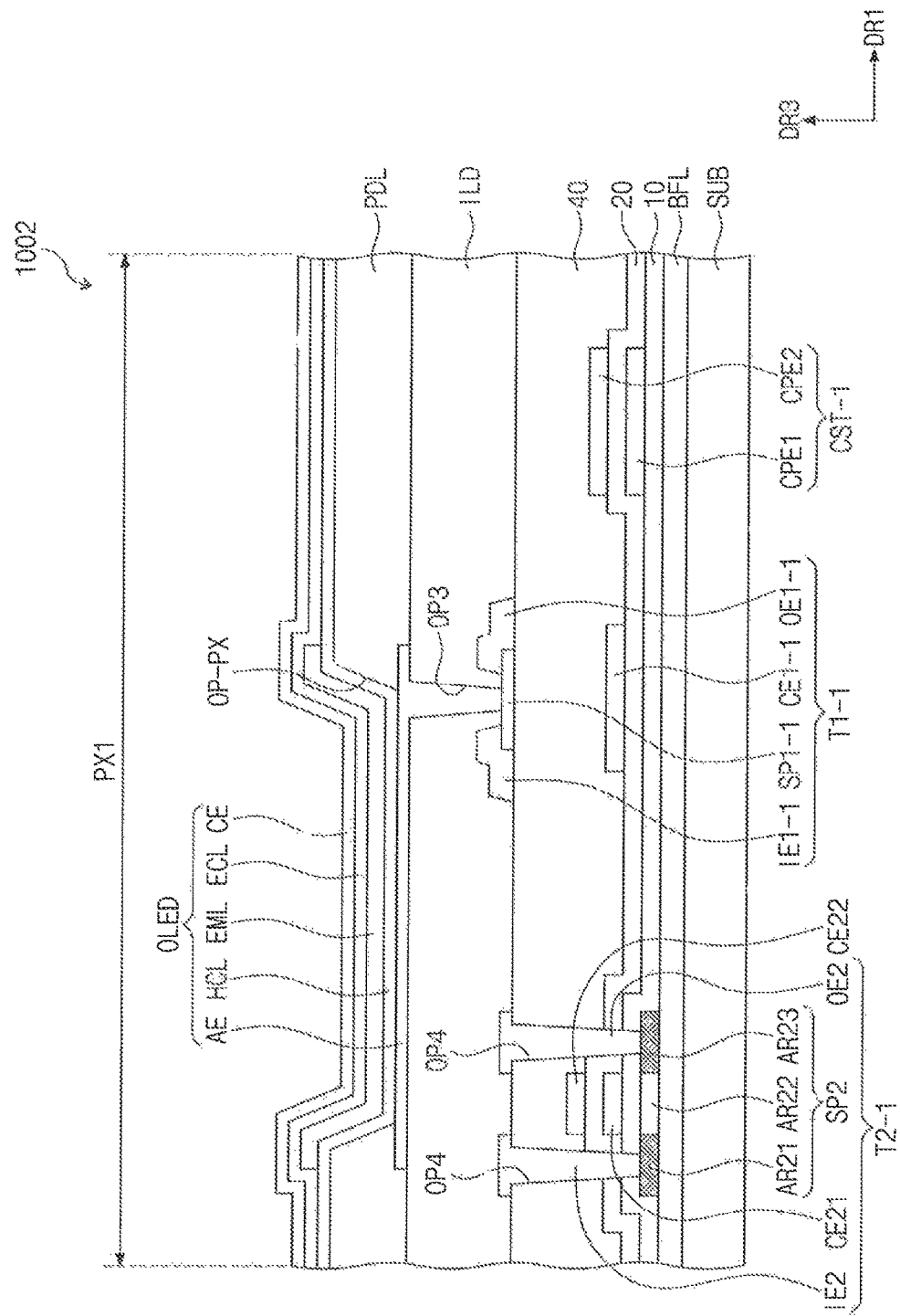
FIG. 6A is a partial cross-sectional view of an organic light emitting display device corresponding to a first pixel of FIG. 1 according to an exemplary embodiment of the present inventive concept.

FIG. 6A is a partial cross-sectional view of an organic light emitting display device 1002 corresponding to the first pixel PX1 of FIG. 1 according to an exemplary embodiment of the present inventive concept. FIG. 6B is a partial cross-sectional view of an organic light emitting display device 1002 corresponding to the second pixel PX2 of FIG. 1 according to an exemplary embodiment of the present inventive concept.

While the folding driving transistor T1 of the organic light emitting display device 1001 described with reference to FIGS. 5A and 5B has a top-gate structure, there is a difference in that the folding driving transistor T1-1 of the organic light emitting display device 1002 described with reference to FIGS. 6A and 6B has a bottom-gate structure. The rest of the elements of the organic light emitting devices 1001 and 1002 are substantially similar.

As shown in 6A, the first pixel PX1 of the organic light emitting display device 1002 includes a folding driving transistor T1-1, a folding control transistor T2-1, a capacitor CST-1, and an organic light emitting diode OLED.

The folding driving transistor T1-1 includes a first control electrode CE1-1 disposed on the second insulation layer 20, a first semiconductor pattern SP1-1 disposed on the fourth insulation layer 40, and a first input electrode IE1-1 and a first output electrode OE1-1 disposed on the fourth insulation layer 40. The first control electrode CE1-1 may be disposed between the second insulation layer 20 and the fourth insulation layer 40. The first control electrode CE1-1 may be disposed on the same layer as the auxiliary electrode CE22 and the second capacitor electrode CPE2.

The first semiconductor pattern SP1-1 may be disposed on the first control electrode CE-1. The first semiconductor pattern SP1-1 overlaps the first control electrode CE1-1 in a plane view. The first input electrode IE1-1 and the first output electrode OE1-1 are disposed on the fourth insulation layer 40 to partially cover the first semiconductor pattern SP1-1. The folding driving transistor T1-1 may further include an ohmic contact layer in an area contacting each of the first input electrode IE1-1 and the first output electrode OE1-1 of the first semiconductor pattern SP1-1.

The folding control transistor T2-1 includes a second semiconductor pattern SP2 disposed on the buffer layer BFL, a first sub control electrode CE21 disposed on the first insulation layer 10, and a second input electrode IE2 and a second output electrode OE2 disposed on the fourth insulation layer 40. The second input electrode IE2 and the second output electrode OE2 are respectively connected to the first area AR21 and the third area AR23 of the second semiconductor pattern SP2 through fourth through holes OP4 penetrating the first insulation layer 10, the second insulation layer 20 and the fourth insulation layer 40. The first pixel PX1 may further include the auxiliary electrode CE22 disposed on the second insulation layer 20.

Figure 6B:
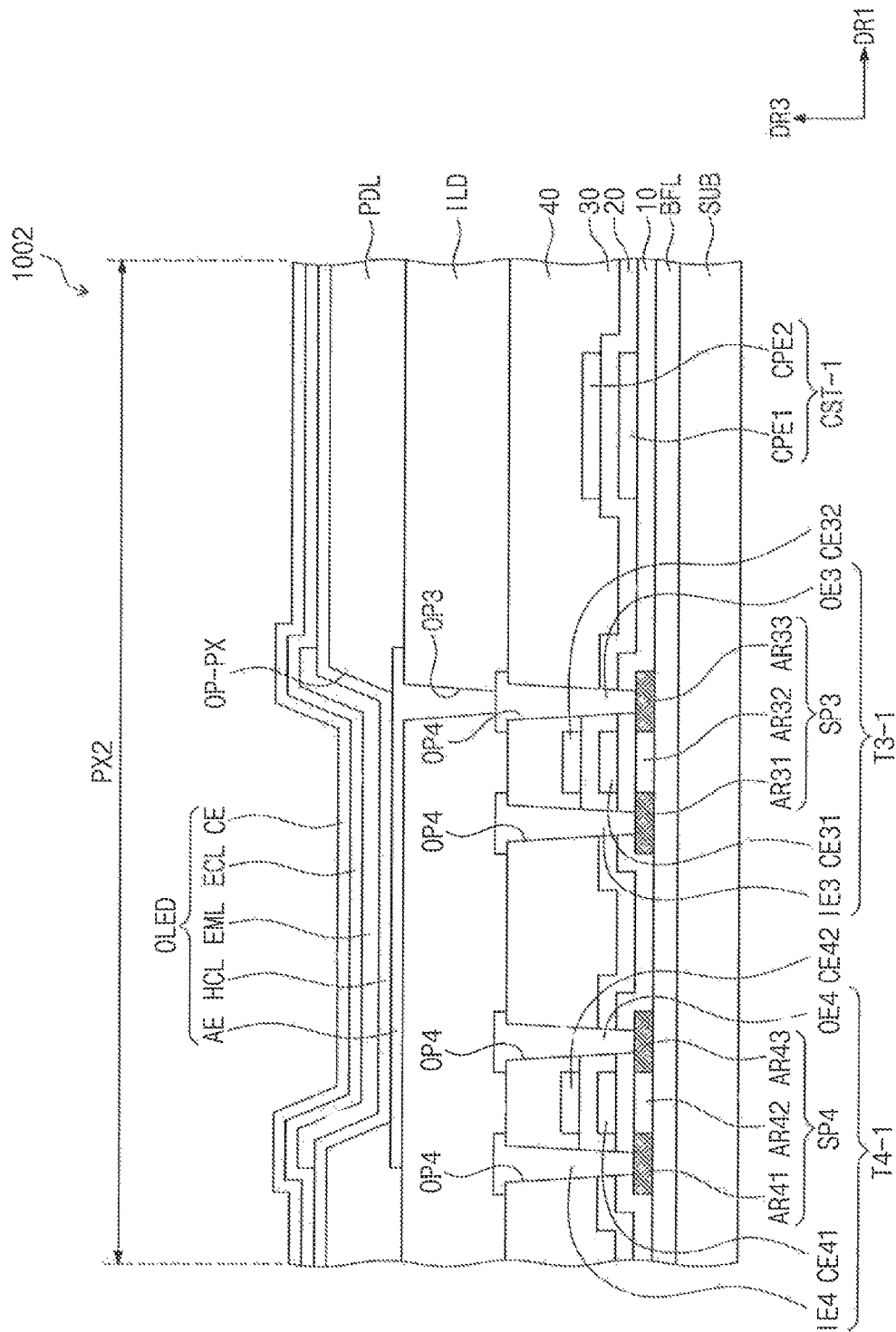
FIG. 6B is a partial cross-sectional view of an organic light emitting display device corresponding to a second pixel of FIG. 1 according to an exemplary embodiment of the present inventive concept.

In the organic light emitting display device 1002 shown in FIGS. 6A and 6B, the first control electrode CE1-1 and the first semiconductor pattern SP1-1 are insulated from each other by the fourth insulation layer 40. Therefore, unlike the organic light emitting display device 1001 shown in FIGS. 5A and 5B, the organic light emitting display device 1002 shown in FIGS. 6A and 6B may omit the third insulation layer 30.

Referring to FIG. 6B, the second pixel PX2 of the organic light emitting display device 1002 includes a flat driving transistor T3-1, a flat control transistor T4-1, a capacitor CST-1, and an organic light emitting diode OLED.

The flat driving transistor T3-1 includes a third semiconductor pattern SP3, a first sub control electrode CE31, a first input electrode IE3, and a first output electrode OE3. The third semiconductor pattern SP3 may be divided into a first area AR31 including an impurity, a third area AR33 including an impurity, and a second area AR32 disposed between the first area AR31 and the third area AR33.

The flat control transistor T4-1 includes a fourth semiconductor pattern SP4, a first sub control electrode CE41, a second input electrode IE4, and a second output electrode OE4. The fourth semiconductor pattern SP4 may be divided into a first area AR41 including an impurity, a third area AR43 including an impurity, and a second area AR42 disposed between the first area AR41 and the third area AR43.

The second pixel PX2 may include auxiliary electrodes CE32 and CE42.

The configurations of the folding control transistor T2-1 shown in FIG. 6A, the flat driving transistor T3-1 shown in FIG. 6B, and the flat control transistor T4-1 shown in FIG. 6B may have substantially the same structure as each other.

In the organic light emitting display device 1002 shown in FIGS. 6A and 6B, the folding driving transistor T1-1 has a bottom-gate structure. In other words, first semiconductor pattern SP1-1 of the folding driving transistor T1-1 may have a structure disposed on the second control electrode CE-1. Accordingly, the first input electrode IE1-1 and the first output electrode OE1-1 may directly contact the first semiconductor pattern SP1-1 without an additional through hole. The organic light emitting display device 1002 described with reference to FIGS. 6A and 6B may have a similar effect, while including relatively small insulation films with respect to the organic light emitting display device 1001 described with reference to FIGS. 5A and 5B.

Hereinafter, an organic light emitting display device 1003 according to an exemplary embodiment of the present inventive concept is described with reference to FIGS. 7A and 7B.

Figure 7A:
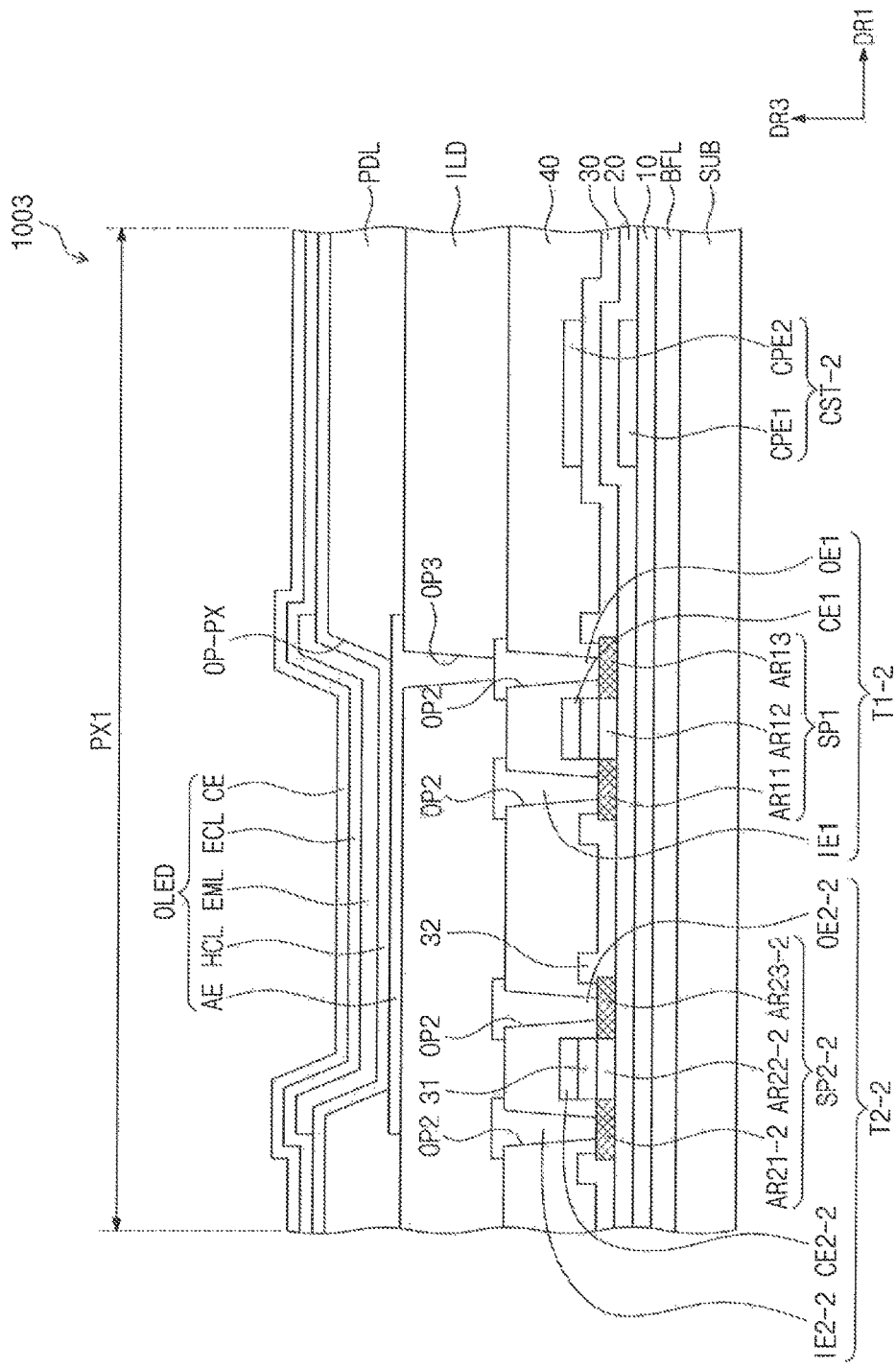
FIG. 7A is a partial cross-sectional view of an organic light emitting display device corresponding to a first pixel of FIG. 1 according to an exemplary embodiment of the present inventive concept.

FIG. 7A is a partial cross-sectional view of an organic light emitting display device 1003 corresponding to the first pixel PX1 of FIG. 1 according to an exemplary embodiment of the present inventive concept. FIG. 7B is a partial cross-sectional view of an organic light emitting display device 1003 corresponding to the second pixel PX2 of FIG. 1 according to an exemplary embodiment of the present inventive concept.

Referring to 7A, the first pixel PX1 of the organic light emitting display device 1003 includes a folding driving transistor T1-2, a folding control transistor T2-2, a capacitor CST-2, and an organic light emitting diode OLED.

The folding driving transistor T1-2, the capacitor CST-2, and the organic light emitting diode OLED shown in FIG. 7A are substantially identical to the folding driving transistor T1, the capacitor CST, and the organic light emitting diode OLED shown in FIG. 5A, and thus, a description thereof may be omitted, and the same reference numerals may be given to corresponding components.

The folding control transistor T2-2 has substantially the same structure as the folding driving transistor T1-2.

The folding control transistor T2-2 includes a second input electrode IE2-2, a second output electrode OE2-2, a second control electrode CE2-2, and a second semiconductor pattern SP2-2. The second semiconductor pattern SP2-2 may be divided into a first area AR21-2 and a third area AR23-2 including an impurity, and a second area AR22-2 disposed between the first area AR21-2 and the third area AR23-2.

The second input electrode IE2-2, the second output electrode OE2-2, the second control electrode CE2-2, and the second semiconductor pattern SP2-2 of the folding control transistor T2-2 are respectively disposed on the same layers as and respectively have the same material as the first input electrode IE1, the first output electrode OE1, the first control electrode CE1, and the first semiconductor pattern SP1 of the folding driving transistor T1-2.

Figure 7B:
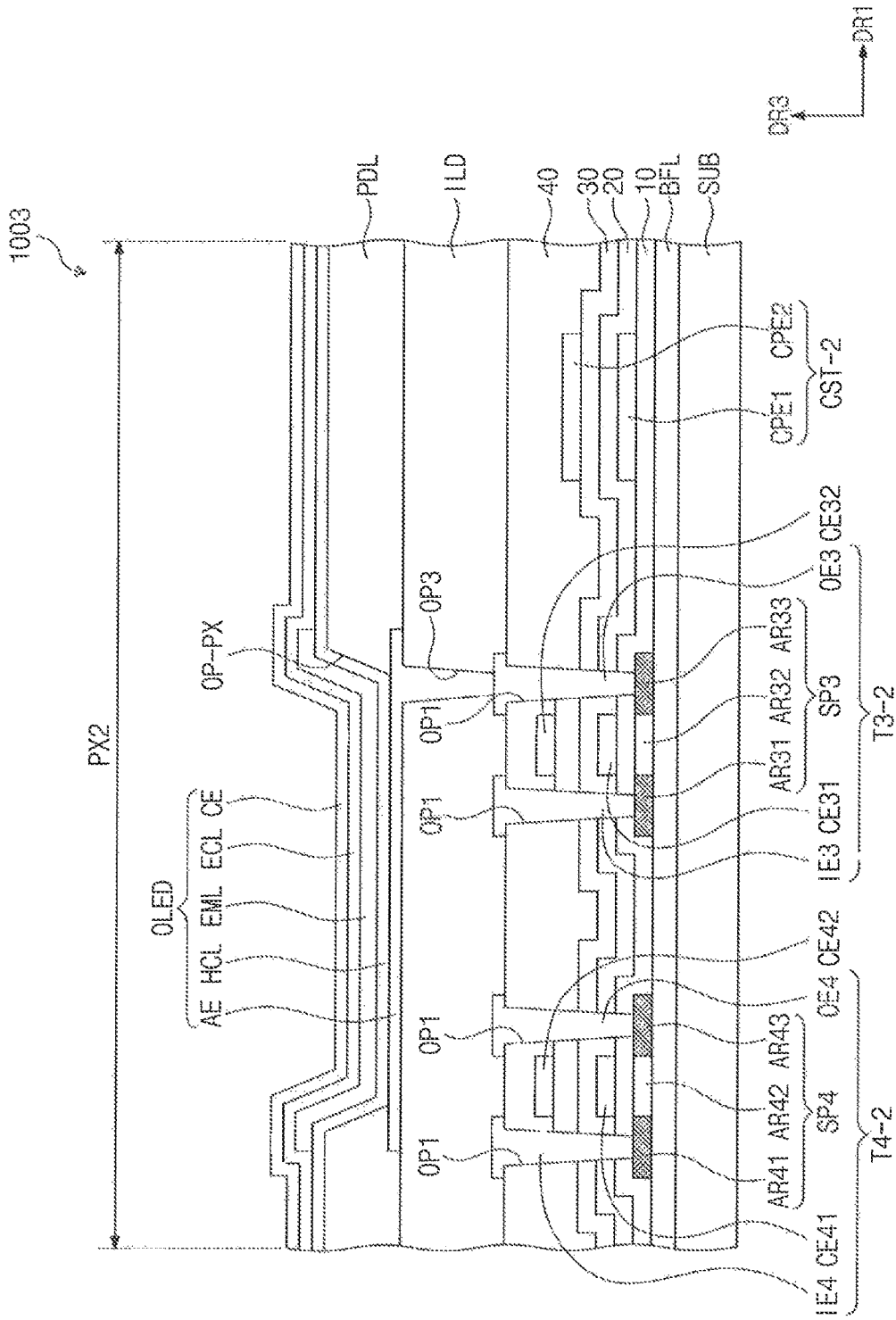
FIG. 7B is a partial cross-sectional view of an organic light emitting display device corresponding to a second pixel of FIG. 1 according to an exemplary embodiment of the present inventive concept.

Referring to FIG. 7B, the second pixel PX2 of the organic light emitting display device 1003 includes a flat driving transistor T3-2, a flat control transistor T4-2, a capacitor CST-2, and an organic light emitting diode OLED.

Since the flat driving transistor T3-2 and the flat control transistor T4-2 shown in FIG. 7B are substantially the same as the flat driving transistor T3 and the flat control transistor T4 shown in FIG. 5B, its description may be omitted, and the same reference numerals may be given to the corresponding components.

The first semiconductor pattern SP1 and the second semiconductor pattern SP2-2 may include an oxide semiconductor and the third semiconductor pattern SP3 and the fourth semiconductor pattern SP4 may include polycrystalline silicon.

When a plurality of transistors included in one pixel PX1 or PX2 have the same structure, compared to a case where it is not, the manufacturing process may be simpler, and as a result, the yield may be increased and the manufacturing cost may be reduced.

According to the organic light emitting display device 1003 according to the exemplary embodiment of the present inventive concept described with reference to FIGS. 7A and 7B, since the first semiconductor pattern SP1 of the folding driving transistor T1-2 of the first pixel PX1 includes an oxide semiconductor, the degradation and cracking of an element disposed in the folding part FP due to the bending of the organic light emitting display device 1003 may be prevented.

In addition, according to the organic light emitting display device 1003, the folding driving transistor T1-2 and the folding control transistor T2-2 included in the first pixel PX1 have the same structure, and the flat driving transistor T3-2 and the flat control transistor T4-2 included in the second pixel PX2 have the same structure. Therefore, the efficiency and cost effectiveness of the manufacturing process may be increased.

Hereinafter, an organic light emitting display device 1004 according to an exemplary embodiment of the present inventive concept is described with reference to FIGS. 8A and 8B.

Figure 8A:
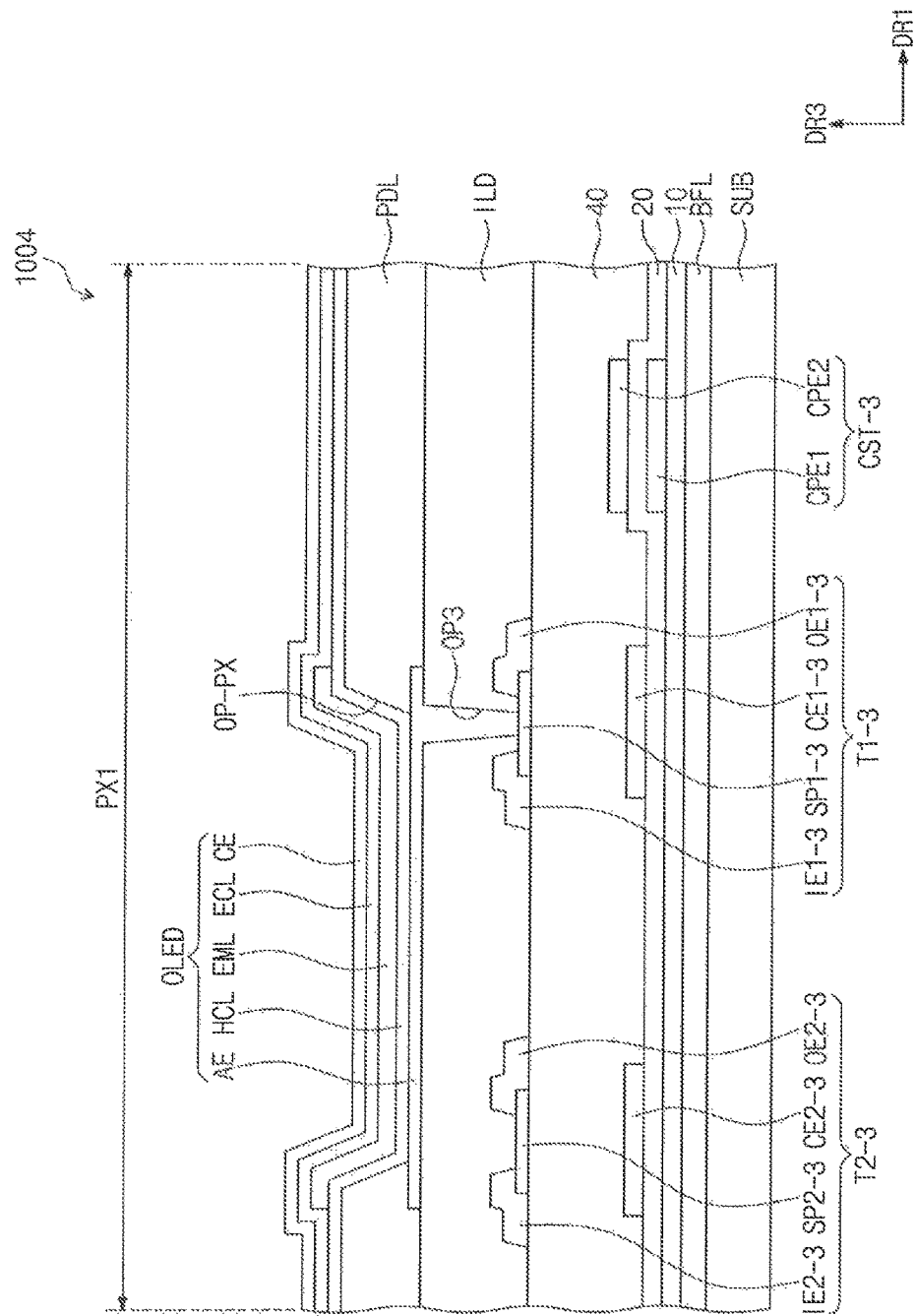
FIG. 8A is a partial cross-sectional view of an organic light emitting display device corresponding to a first pixel of FIG. 1 according to an exemplary embodiment of the present inventive concept.

FIG. 8A is a partial cross-sectional view of an organic light emitting display device 1004 corresponding to the first pixel PX1 of FIG. 1 according to an exemplary embodiment of the present inventive concept. FIG. 8B is a partial cross-sectional view of the organic light emitting display device 1004 corresponding to the second pixel PX2 of FIG. 1 according to an exemplary embodiment of the present inventive concept.

While each of the folding driving transistor T1-2 and the folding control transistor T2-2 of the organic light emitting display device 1003 described with reference to FIGS. 7A and 7B has a top-gate structure, there is a difference in that each of the folding driving transistor T1-3 and the folding control transistor T2-3 of the organic light emitting display device 1004 described with reference to FIGS. 8A and 8B has a bottom-gate structure. The rest of the elements of organic light emitting devices 1003 and 1004 are substantially similar.

The first pixel PX1 of the organic light emitting display device 1004 includes a folding driving transistor T1-3, a folding control transistor T2-3, a capacitor CST-3, and an organic light emitting diode OLED.

The folding driving transistor T1-3 includes a first control electrode CE1-3, a first semiconductor pattern SP1-3, a first input electrode IE1-3, and a first output electrode OE1-3.

The folding control transistor T2-3 may include a second control electrode CE2-3, a second semiconductor pattern SP2-3, a second input electrode IE2-3, and a second output electrode OE2-3.

The folding driving transistor T1-3 and the folding control transistor T2-3 have substantially the same structure as the folding driving transistor T1-1 shown in FIG. 6A, and thus, a description thereof may be omitted.

Figure 8B:
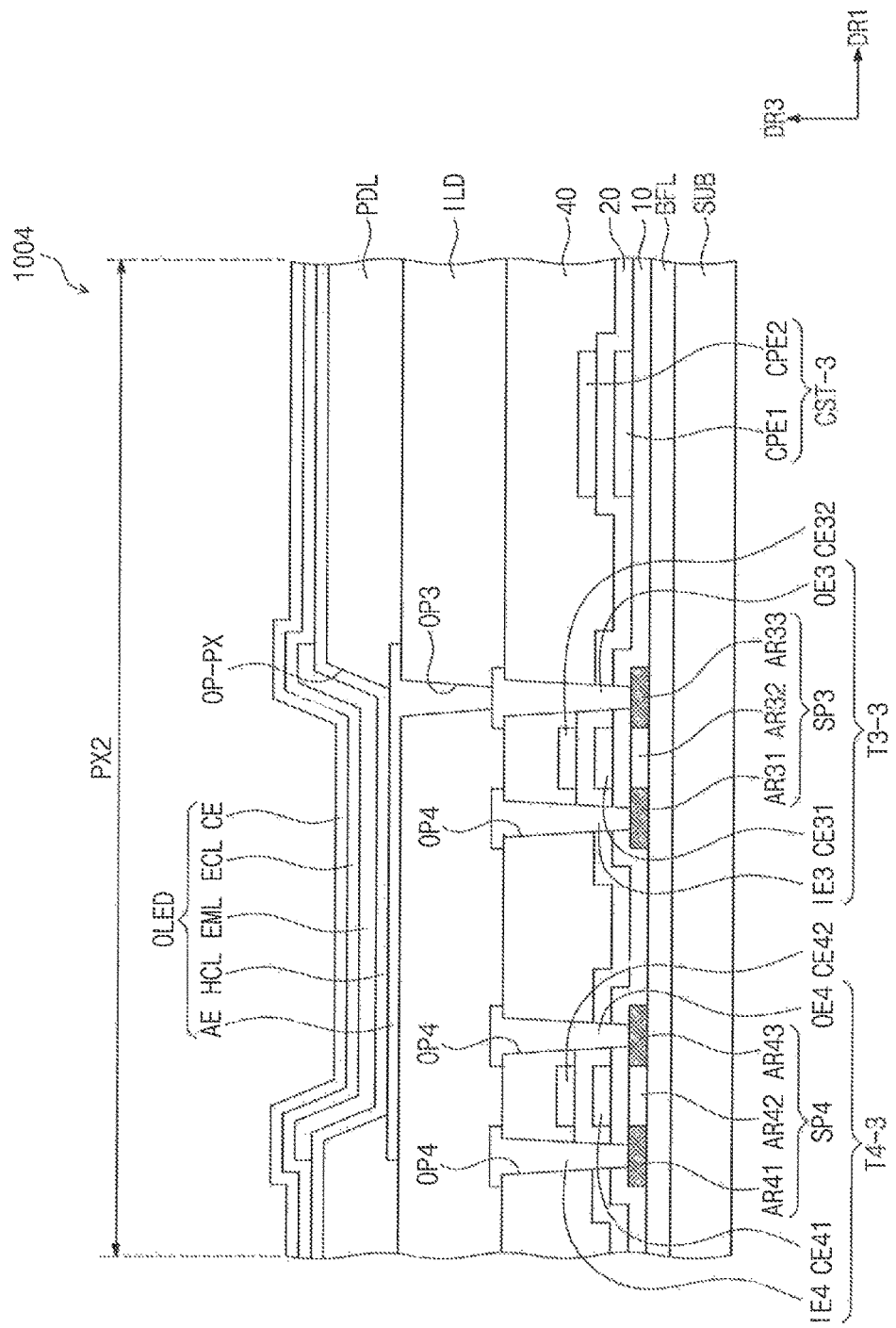
FIG. 8B is a partial cross-sectional view of an organic light emitting display device corresponding to a second pixel of FIG. 1 according to an exemplary embodiment of the present inventive concept.

Referring to FIG. 8B, the second pixel PX2 of the organic light emitting display device 1004 includes a flat driving transistor T3-3, a flat control transistor T4-3, a capacitor CST-3, and an organic light emitting diode OLED.

The flat driving transistor T3-3 includes a third semiconductor pattern SP3, a first sub control electrode CE31, a first input electrode IE3, and a first output electrode OE3. The third semiconductor pattern SP3 may be divided into a first area AR31 including an impurity, a third area AR33 including an impurity, and a second area AR32 disposed between the first area AR31 and the third area AR33.

The flat driving transistor T4-3 includes a fourth semiconductor pattern SP4, a first sub control electrode CE41, a second input electrode IE4, and a second output electrode OE4. The fourth semiconductor pattern SP4 may be divided into a first area AR41 including an impurity, a third area AR43 including an impurity, and a second area AR42 disposed between the first area AR41 and the third area AR43.

The second pixel PX2 may include auxiliary electrodes CE32 and CE42.

The flat driving transistor T3-3 and the flat control transistor T4-3 have substantially the same structure as the flat driving transistor T3-1 and the flat control transistor T4-1 shown in FIG. 6B. Thus, a description thereof may be omitted.

In the organic light emitting display device 1004 shown in FIGS. 8A and 8B, each of the folding driving transistor T1-3 and the folding control transistor T2-3 may have a bottom gate structure. The organic light emitting display device 1004 described with reference to FIGS. 8A and 8B may have a similar effect, while including relatively small insulation films, with respect to the organic light emitting display device 1003 described with reference to FIGS. 7A and 7B.

Hereinafter, an organic light emitting display device 1005 according to an exemplary embodiment of the present inventive concept is described with reference to FIGS. 9A and 9B.

Figure 9A:
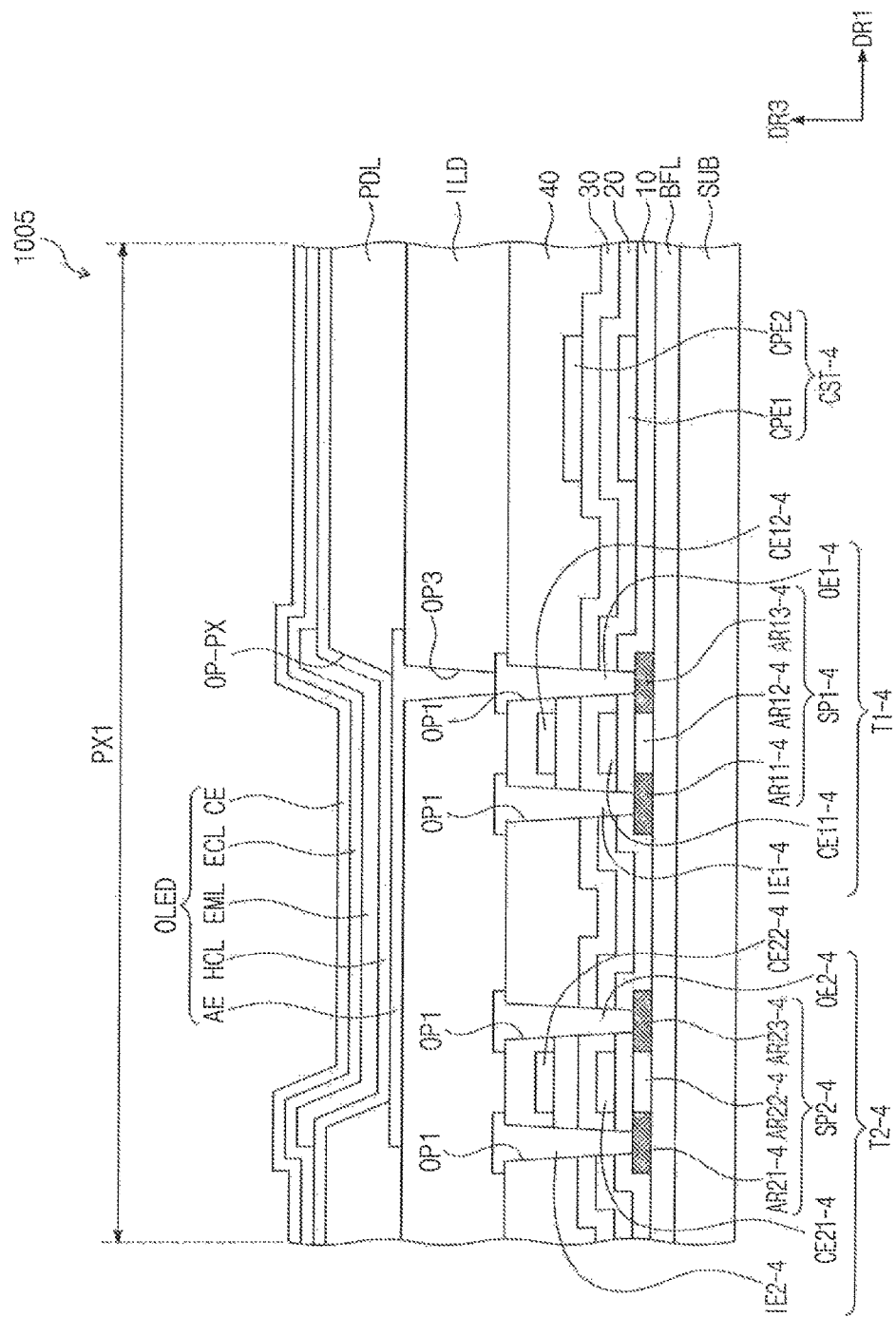
FIG. 9A is a partial cross-sectional view of an organic light emitting display device corresponding to a first pixel of FIG. 1 according to an exemplary embodiment of the present inventive concept.

FIG. 9A is a partial cross-sectional view of an organic light emitting display device 1005 corresponding to the first pixel PX1 of FIG. 1 according to an exemplary embodiment of the present inventive concept. FIG. 9B is a partial cross-sectional view of an organic light emitting display device 1005 corresponding to the second pixel PX2 of FIG. 1 according to an exemplary embodiment of the present inventive concept.

Referring to 9A, the first pixel PX1 of the organic light emitting display device 1005 includes a folding driving transistor T1-4, a folding control transistor T2-4, a capacitor CST-4, and an organic light emitting diode OLED.

The folding drive transistor T1-4 includes a first semiconductor pattern SP1-4, a first sub control electrode CE11-4, a first input electrode IE1-4, and a first output electrode OE1-4. The first semiconductor pattern SP1-4 includes a first area AR11-4 including an impurity, a third area AR13-4 including an impurity, and a second area AR12-4 disposed between the first area AR11-4 and the third area AR13-4.

The folding control transistor T2-4 includes a second semiconductor pattern SP2-4, a first sub control electrode CE21-4, a second input electrode IE2-4, and a second output electrode OE2-4. The second semiconductor pattern SP2-4 may be divided into a first area AR21-4 including an impurity, a third area AR23-4 including an impurity, and a second area AR22-4 disposed between the first area AR21-4 and the third area AR23-4. The first pixel PX1 may further include auxiliary electrodes CE12-4 and CE22-4.

A sectional structure of the folding driving transistor T1-4 and the folding control transistor T2-4 is substantially the same as that of the folding driving transistor T2 shown in FIG. 5A, and thus, a description thereof may be omitted.

Figure 9B:
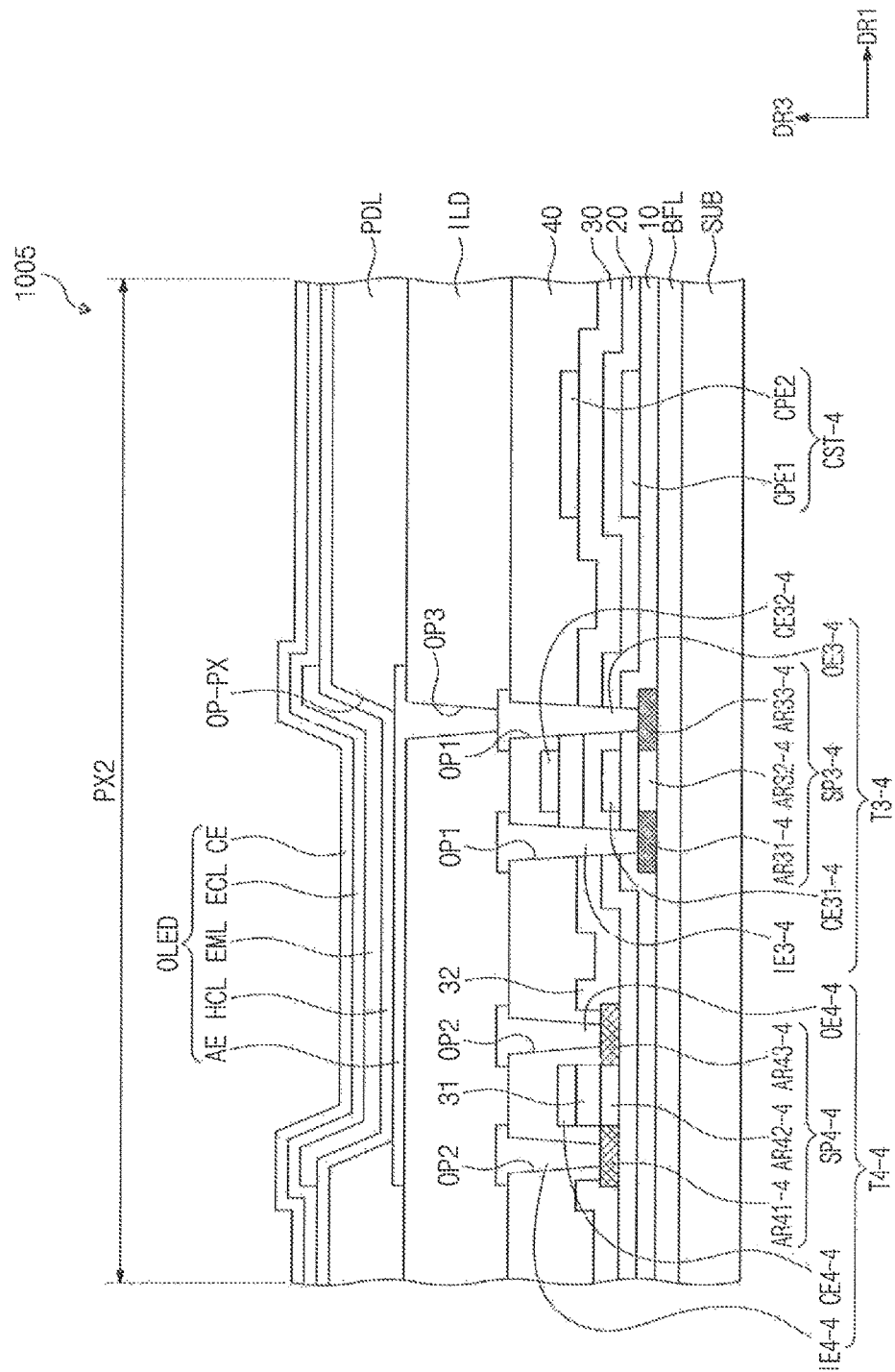
FIG. 9B is a partial cross-sectional view of an organic light emitting display device corresponding to a second pixel of FIG. 1 according to an exemplary embodiment of the present inventive concept.

Referring to FIG. 9B, the second pixel PX2 of the organic light emitting display device 1005 includes a flat driving transistor T3-4, a flat control transistor T4-4, a capacitor CST-4, and an organic light emitting diode OLED.

The flat driving transistor T3-4 includes a third semiconductor pattern SP3-4, a first sub control electrode CE31-4, a first input electrode IE3-4, and a first output electrode OE3-4. The third semiconductor pattern SP3-4 includes a first area AR31-4 including an impurity, a third area AR33-4 including an impurity, and a second area AR32-4 disposed between the first area AR31-4 and the third area AR33-4. The second pixel PX2 may further include an auxiliary electrode CE32-4.

A sectional structure of the flat driving transistor T3-4 is substantially the same as that of the flat driving transistor T3 shown in FIG. 5B, and thus, a description thereof may be omitted.

The flat control transistor T4-4 includes a fourth semiconductor pattern SP4-4, a second control electrode CE4-4, a second input electrode IE4-4, and a second output electrode OE4-4. The fourth semiconductor pattern SP4-4 includes a first area AR41-4 including an impurity, a third area AR43-4 including an impurity, and a second area AR42-4 disposed between the first area AR41-4 and the third area AR43-4.

A sectional structure of the flat control transistor T4-4 is substantially the same as that of the folding driving transistor T1 shown in FIG. 5A, and thus, a description thereof may be omitted.

Figure 9C:
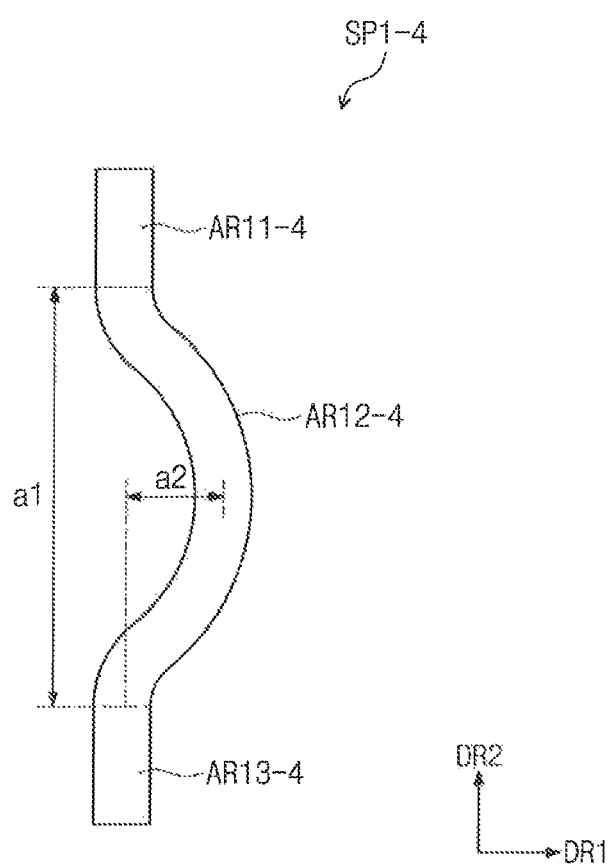
FIG. 9C is a plan view illustrating a first semiconductor pattern of a folding driving transistor shown in FIG. 9A according to an exemplary embodiment of the present inventive concept.

FIG. 9C is a plan view illustrating a first semiconductor pattern SP1-4 of a folding driving transistor T1-4 shown in FIG. 9A.

A first semiconductor pattern SP1-4 may have a shape extending approximately along a second direction DR2. The first area AR11-4 and the third area AR13-4 may be disposed apart from each other in the second direction DR2. The second area AR12-4 disposed between the first area AR11-4 and the third area AR13-4 connects the first area AR11-4 and the third area AR13-4.

The second area AR12-4 is the channel area of the folding driving transistor T1-4. As the movement direction of carriers in the channel area of a transistor becomes random, the durability with respect to bending may be increased.

In an exemplary embodiment of the present inventive concept, the second area AR12-4 of the first semiconductor pattern SP1-4 may be bent concavely or convexly in a first direction DR1 perpendicular to the folding axis FX extending in the second direction DR2 (see FIG. 1). In other words, the bend of the second area AR12-4 extends in the first direction DR1.

The second area AR12-4 may have a vertical length a1 extending in the second direction DR2. In addition, since the second area AR12-4 may be bent concavely or convexly in the first direction DR1, the second area AR12-4 may protrude away from the first area AR11-4 and the third area AR31-4 by a protrusion length a2 extending in the first direction DR1.

In an exemplary embodiment of the present inventive concept, a ratio of the vertical length a1 to the protrusion length a2 may be more than 0.3 and less than 1.

In an exemplary embodiment of the present inventive concept, the second semiconductor pattern SP2-4 of the folding control transistor T2-4 may have substantially the same shape as the first semiconductor pattern SP1-4.

According to the organic light emitting display device 1005 described with reference to FIGS. 9A to 9C, the flat control transistor T4-4 of the second pixel PX2 disposed in the flat part TP, which has a larger area than that of the folding part FP, includes an oxide semiconductor. Therefore, the leakage current of the second pixel PX2 may be lowered, and the power consumption of the organic light emitting display device 1005 may be decreased. In an exemplary embodiment of the present inventive concept, the flat driving transistor T3-4 may have polycrystalline silicon.

The folding driving transistor T1-4 and the folding control transistor T2-4 of the first pixel PX1 have polycrystalline silicon. At least one of the folding drive transistor T1-4 and the folding control transistor T2-4 of the first pixel PX1 has a curved channel area. Therefore, the organic light emitting diode display 1005 may have an increased durability against degradation from bending.

Hereinafter, an organic light emitting display device 1006 according to an exemplary embodiment of the present inventive concept is described with reference to FIGS. 10A and 10B.

Figure 10A:
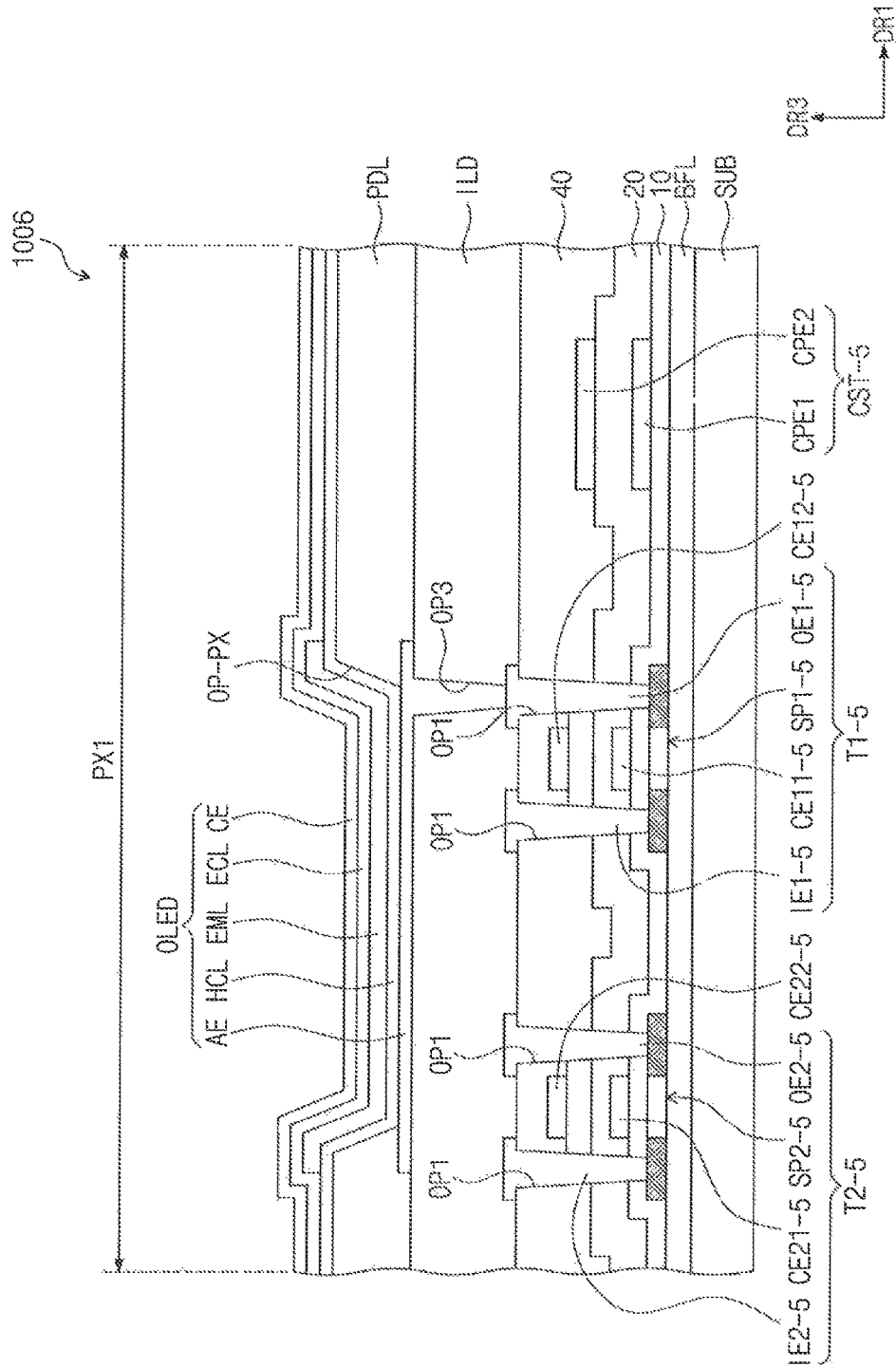
FIG. 10A is a partial cross-sectional view of an organic light emitting display device corresponding to a first pixel of FIG. 1 according to an exemplary embodiment of the present inventive concept.

FIG. 10A is a partial cross-sectional view of an organic light emitting display device 1006 corresponding to the first pixel PX1 of FIG. 1 according to an exemplary embodiment of the present inventive concept. FIG. 10B is a partial cross-sectional view of the organic light emitting display device 1004 corresponding to the second pixel PX2 of FIG. 1 according to an exemplary embodiment of the present inventive concept.

While each of the folding driving transistor T1-4 and the folding control transistor T2-4 of the organic light emitting display device 1005 described with reference to FIGS. 9A and 9B has a top-gate structure, there is a difference in that the flat control transistor T4-5 of the organic light emitting display device 1006 described with reference to FIGS. 10A and 10B has a bottom-gate structure. The rest of the elements of the organic light emitting devices 1005 and 1006 are substantially similar.

The first pixel PX1 of the organic light emitting display device 1006 includes a folding driving transistor T1-5, a folding control transistor T2-5, a capacitor CST-5, and an organic light emitting diode OLED.

The folding driving transistor T1-5 includes a first sub control electrode CE11-5, a second sub control electrode CE12-5, a first semiconductor pattern SP1-5, a first input electrode IE1-5, and a first output electrode OE1-5.

The folding control transistor T2-5 includes a first sub control electrode CE21-5, a second semiconductor pattern SP2-5, a second input electrode IE2-5, and a second output electrode OE2-5. The first pixel PX1 may further include auxiliary electrodes CE12-5 and CE22-5. The second sub control electrode CE12-5 may be the auxiliary electrode CE12-5.

Since the folding driving transistor T1-5 and the folding control transistor T2-5 have substantially the same structure as that of the flat driving transistor T3-1 and the flat control transistor T4-1 shown in FIG. 6B, and thus, a description thereof may be omitted.

Figure 10B:
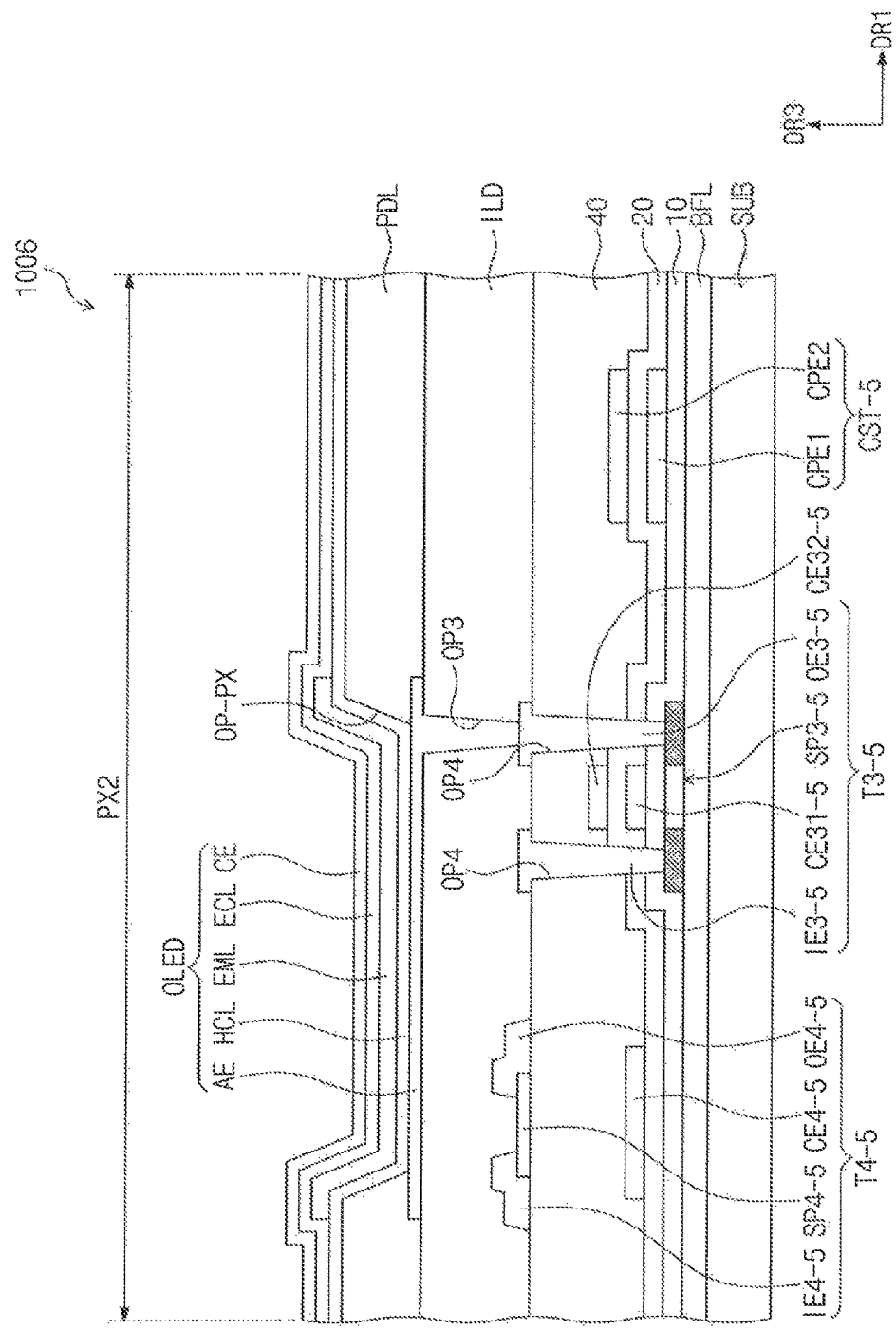
FIG. 10B is a partial cross-sectional view of an organic light emitting display device corresponding to a second pixel of FIG. 1 according to an exemplary embodiment of the present inventive concept.

Referring to FIG. 10B, the second pixel PX2 of the organic light emitting display device 1006 includes a flat driving transistor T3-5, a flat control transistor T4-5, a capacitor CST-5, and an organic light emitting diode OLED.

The flat driving transistor T3-5 includes a third semiconductor pattern SP3-5, a first sub control electrode CE31-5, a first input electrode IE3-5, and a first output electrode OE3-5. The flat driving transistor T3-5 has substantially the same structure as that of the flat driving transistor T3-1 and the flat control transistor T4-1 shown in FIG. 6B. Thus, a description thereof may be omitted. The second pixel PX2 may further include an auxiliary electrode CE32-5.

The flat control transistor T4-5 may include a second control electrode CE4-5, a fourth semiconductor pattern SP4-5, a second input electrode IE4-5, and a second output electrode OE4-5. Since the flat control transistor T4-5 has substantially the same structure as that of the folding driving transistor T1-1 shown in FIG. 6A, a description thereof will be omitted.

In the organic light emitting display device 1006 shown in FIGS. 10A and 10B, the flat control transistor T4-5 may have a bottom gate structure. The organic light emitting display device 1006 described with reference to FIGS. 10A and 10B may have a similar effect, while including relatively small insulation films, with respect to the organic light emitting display device 1005 described with reference to FIGS. 9A and 9B.

Hereinafter, an organic light emitting display device 1007 according to an exemplary embodiment of the present inventive concept is described with reference to FIGS. 11A and 11B.

Figure 11A:
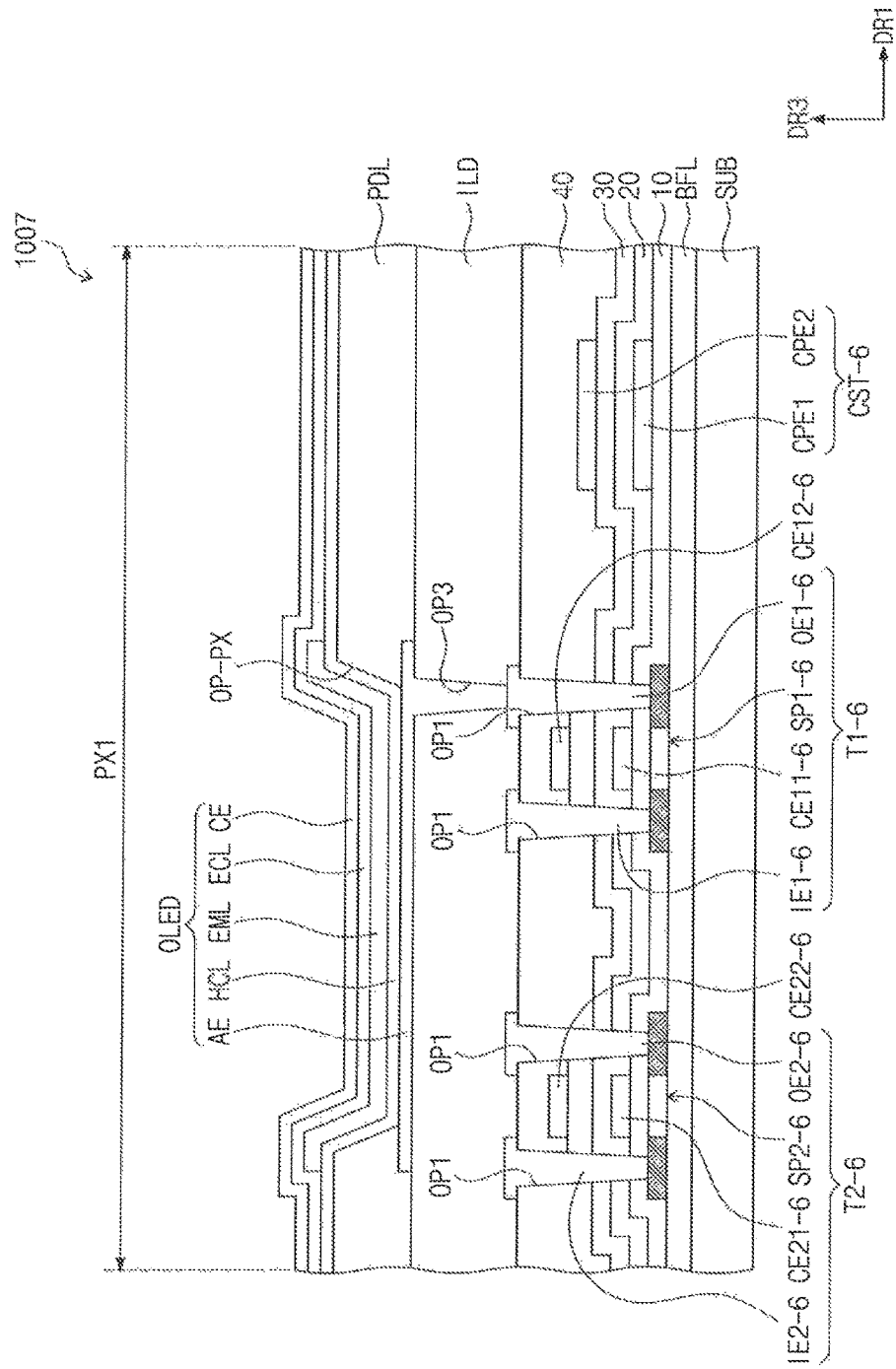
FIG. 11A is a partial cross-sectional view of an organic light emitting display device corresponding to a first pixel of FIG. 1 according to an exemplary embodiment of the present inventive concept.

FIG. 11A is a partial cross-sectional view of an organic light emitting display device 1007 corresponding to the first pixel PX1 of FIG. 1 according to an exemplary embodiment of the present inventive concept. FIG. 1B is a partial cross-sectional view of an organic light emitting display device 1007 corresponding to the second pixel PX2 of FIG. 1 according to an exemplary embodiment of the present inventive concept.

Referring to 11A, the first pixel PX1 of the organic light emitting display device 1007 includes a folding driving transistor T1-6, a folding control transistor T2-6, a capacitor CST-6, and an organic light emitting diode OLED.

The folding drive transistor T1-6 includes a first semiconductor pattern SP1-6, a first sub control electrode CE11-6, a first input electrode IE1-6, and a first output electrode OE1-6.

The folding control transistor T2-6 includes a second semiconductor pattern SP2-6, a first sub control electrode CE21-6, a second input electrode IE2-6, and a second output electrode OE2-6. The first pixel PX1 may further include auxiliary electrodes CE12-6 and CE22-6.

A sectional structure of the folding driving transistor T1-6 and the folding control transistor T2-6 is substantially the same as that of the folding driving transistor T2 shown in FIG. 5A. Thus, a description thereof may be omitted.

The planar shape of the first semiconductor pattern SP1-6 of the folding driving transistor T1-6 may be substantially the same as that of the first semiconductor pattern SP1-4 shown in FIG. 9C.

Figure 11B:
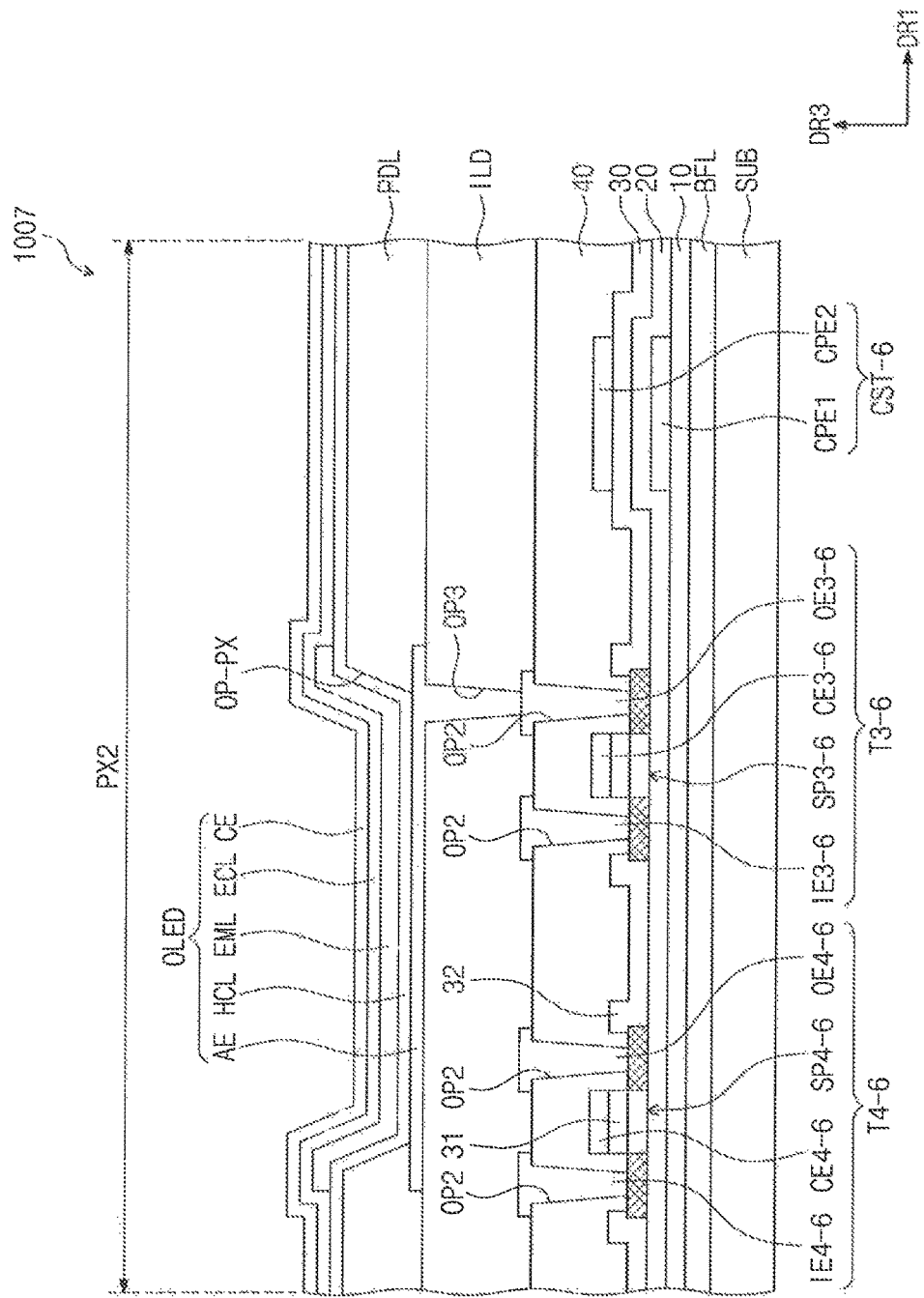
FIG. 11B is a partial cross-sectional view of an organic light emitting display device corresponding to a second pixel of FIG. 1 according to an exemplary embodiment of the present inventive concept.

Referring to FIG. 11B, the second pixel PX2 of the organic light emitting display device 1007 includes a flat driving transistor T3-6, a flat control transistor T4-6, a capacitor CST-6, and an organic light emitting diode OLED.

The flat driving transistor T3-6 includes a third semiconductor pattern SP3-6, a first control electrode CE3-6, a first input electrode IE3-6, and a first output electrode OE3-6.

The flat control transistor T4-6 includes a fourth semiconductor pattern SP4-6, a second control electrode CE4-6, a second input electrode IE4-6, and a second output electrode OE4-6.

A sectional structure of each of the flat driving transistor T3-6 and the flat control transistor T4-6 is substantially the same as that of the folding driving transistor T1 shown in FIG. 5A. Thus, a description thereof may be omitted.

According to the organic light emitting display device 1007 described with reference to FIGS. 11A and 11B, the flat driving transistor T3-6 and the flat control transistor T4-6 of the second pixel PX2 disposed in the flat part TP, which has a larger area than that of the folding part FP, includes an oxide semiconductor. Therefore, the leakage current of the second pixel PX2 may be lowered, and the power consumption of the organic light emitting display device 1007 may be decreased.

The folding driving transistor T1-6 and the folding control transistor T2-6 of the first pixel PX1 have polycrystalline silicon. At least one of the folding drive transistor T1-6 and the folding control transistor T2-6 of the first pixel PX1 has a curved channel area. Therefore, the organic light emitting diode display 1007 may have an increased durability against degradation from bending.

According to the organic light emitting display device 1007 described with reference to FIGS. 1A and 11B, the folding driving transistor T1-6 and the folding control transistor T2-6 included in the first pixel PX1 have the same structure as each other. The flat driving transistor T3-6 and the flat control transistor T4-6 included in the second pixel PX2 have the same structure as each other. Accordingly, the manufacturing process may be relatively simpler, and so that the yield may be increased and the manufacturing cost may be reduced.

Hereinafter, an organic light emitting display device 1008 according to an exemplary embodiment of the present inventive concept is described with reference to FIGS. 12A and 12B.

Figure 12A:
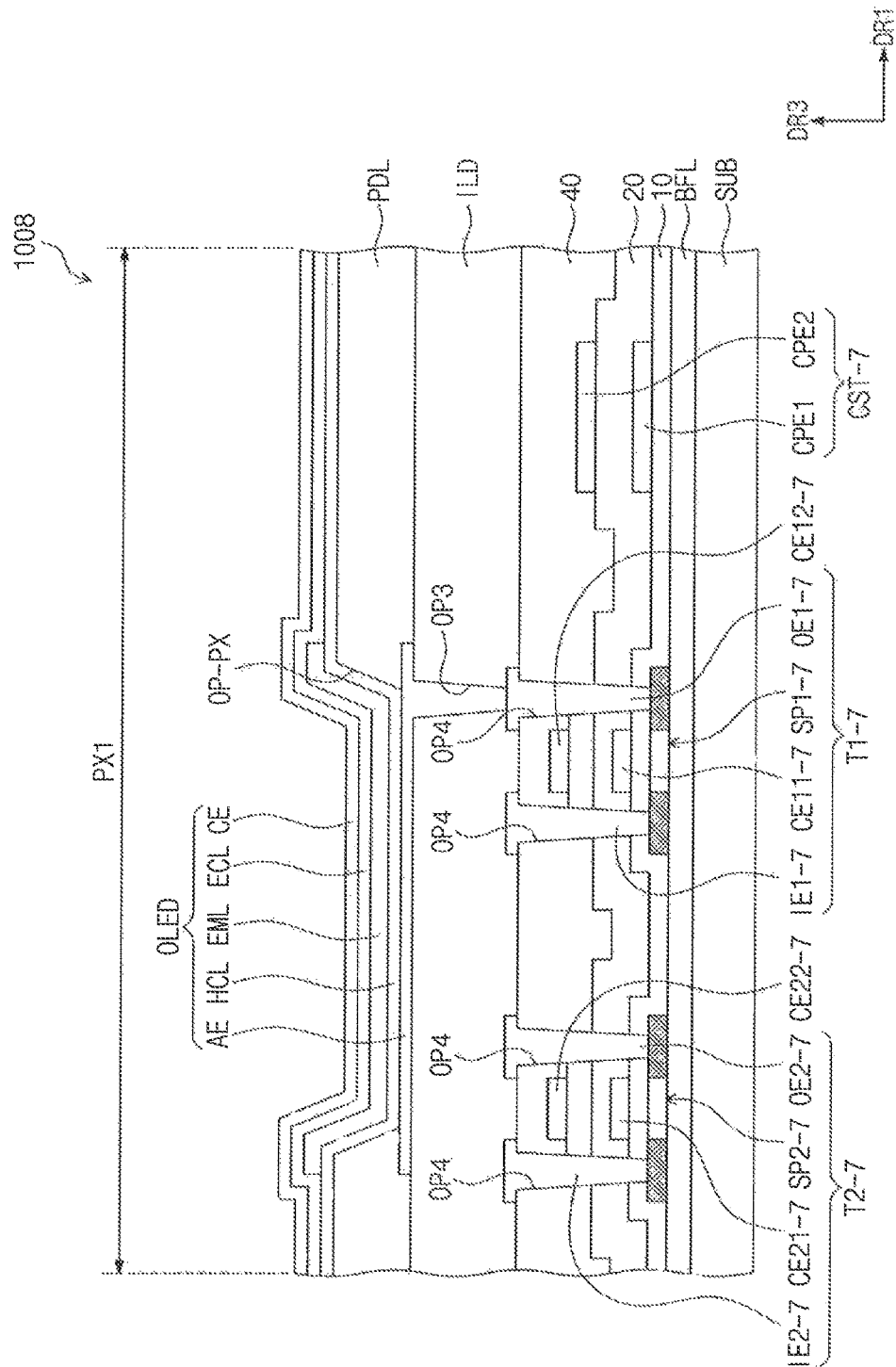
FIG. 12A is a partial cross-sectional view of an organic light emitting display device corresponding to a first pixel of FIG. 1 according to an exemplary embodiment of the present inventive concept.

FIG. 12A is a partial cross-sectional view of an organic light emitting display device 1008 corresponding to the first pixel PX1 of FIG. 1 according to an exemplary embodiment of the present inventive concept. FIG. 12B is a partial cross-sectional view of the organic light emitting display device 1008 corresponding to the second pixel PX2 of FIG. 1 according to an exemplary embodiment of the present inventive concept.

While each of the folding driving transistor T1-6 and the folding control transistor T2-6 of the organic light emitting display device 1007 described with reference to FIGS. 11A and 11B has a top-gate structure, there is a difference in that each of the flat driving transistor T3-7 and the flat control transistor T4-7 of the organic light emitting display device 1008 described with reference to FIGS. 12A and 12B has a bottom-gate structure. The rest of the elements of the organic light emitting devices 1001 and 1002 are substantially similar.

The first pixel PX1 of the organic light emitting display device 1008 includes a folding driving transistor T1-7, a folding control transistor T2-7, a capacitor CST-7, and an organic light emitting diode OLED.

The folding driving transistor T1-7 includes a first sub control electrode CE11-7, a first semiconductor pattern SP1-7, a first input electrode IE1-7, and a first output electrode OE1-7.

The folding control transistor T2-7 includes a first sub control electrode CE21-7, a second semiconductor pattern SP2-7, a second input electrode IE2-7, and a second output electrode OE2-7. The first pixel PX1 may further include auxiliary electrodes CE12-7 and CE22-7.

Since the folding driving transistor T1-7 and the folding control transistor T2-7 have substantially the same structure as that of the flat driving transistor T3-1 and the flat control transistor T4-1 shown in FIG. 6B, a description thereof may be omitted.

Figure 12B:
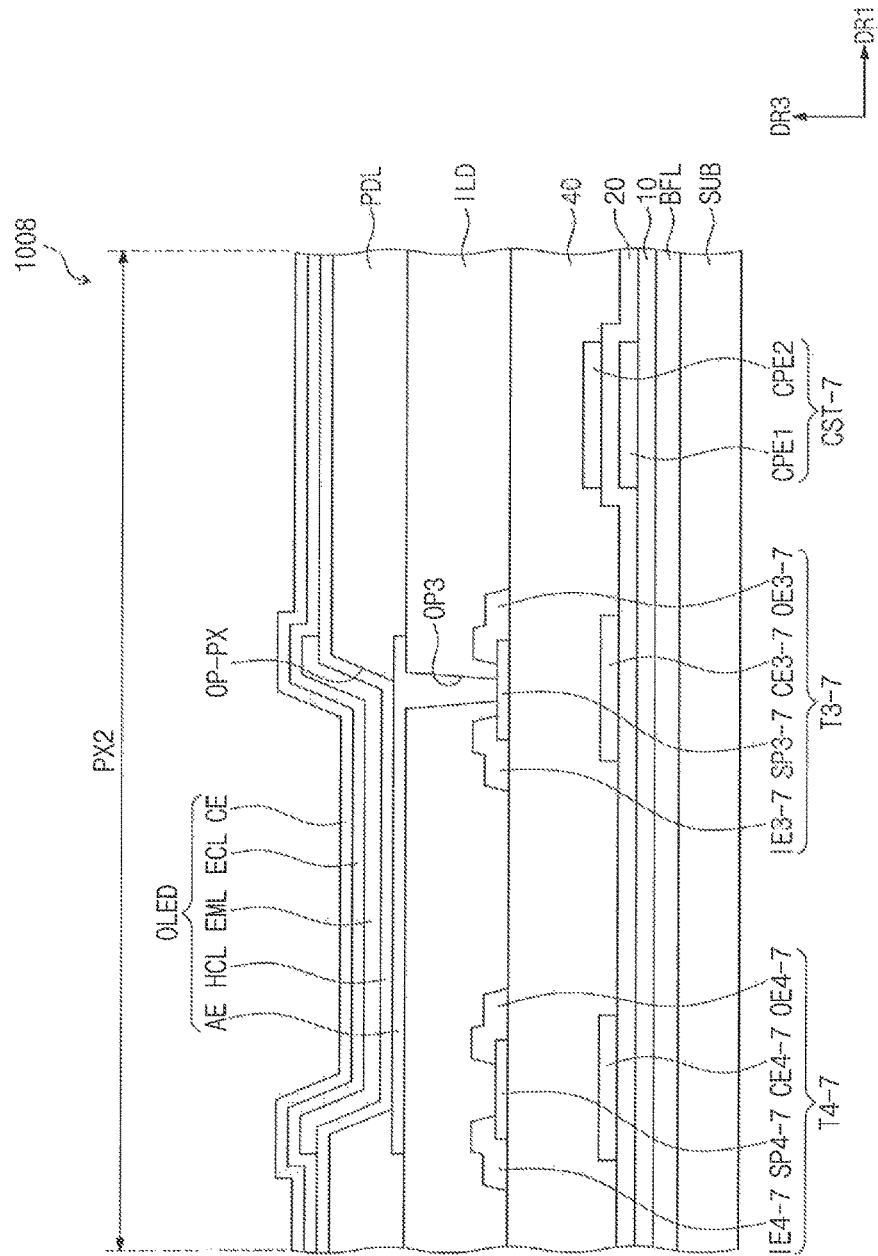
FIG. 12B is a partial cross-sectional view of an organic light emitting display device corresponding to a second pixel of FIG. 1 according to an exemplary embodiment of the present inventive concept.

Referring to FIG. 12B, the second pixel PX2 of the organic light emitting display device 1008 includes a flat driving transistor T3-7, a flat control transistor T4-7, a capacitor CST-7, and an organic light emitting diode OLED.

The flat driving transistor T3-7 includes a first control electrode CE3-7, a third semiconductor pattern SP3-7, a first input electrode IE3-7, and a first output electrode OE3-7.

The flat control transistor T4-7 includes a second control electrode CE4-7, a fourth semiconductor pattern SP4-7, a second input electrode IE4-7, and a second output electrode OE4-7.

The flat driving transistor T3-7 and the flat control transistor T4-7 have substantially the same structure as that of the folding driving transistor T1-1 shown in FIG. 6A. Thus, a description thereof may be omitted.

In the organic light emitting display device 1008 shown in FIGS. 12A and 12B, each of the flat driving transistor T3-7 and the flat control transistor T4-7 may have a bottom gate structure. The organic light emitting display device 1008 described with reference to FIGS. 12A and 12B may have a similar effect, while including relatively small insulation films, with respect to the organic light emitting display device 1007 described with reference to FIGS. 11A and 11B.

Hereinafter, an organic light emitting display device 1009 according to an exemplary embodiment of the present inventive concept is described with reference to FIGS. 13A and 13B.

Figure 13A:
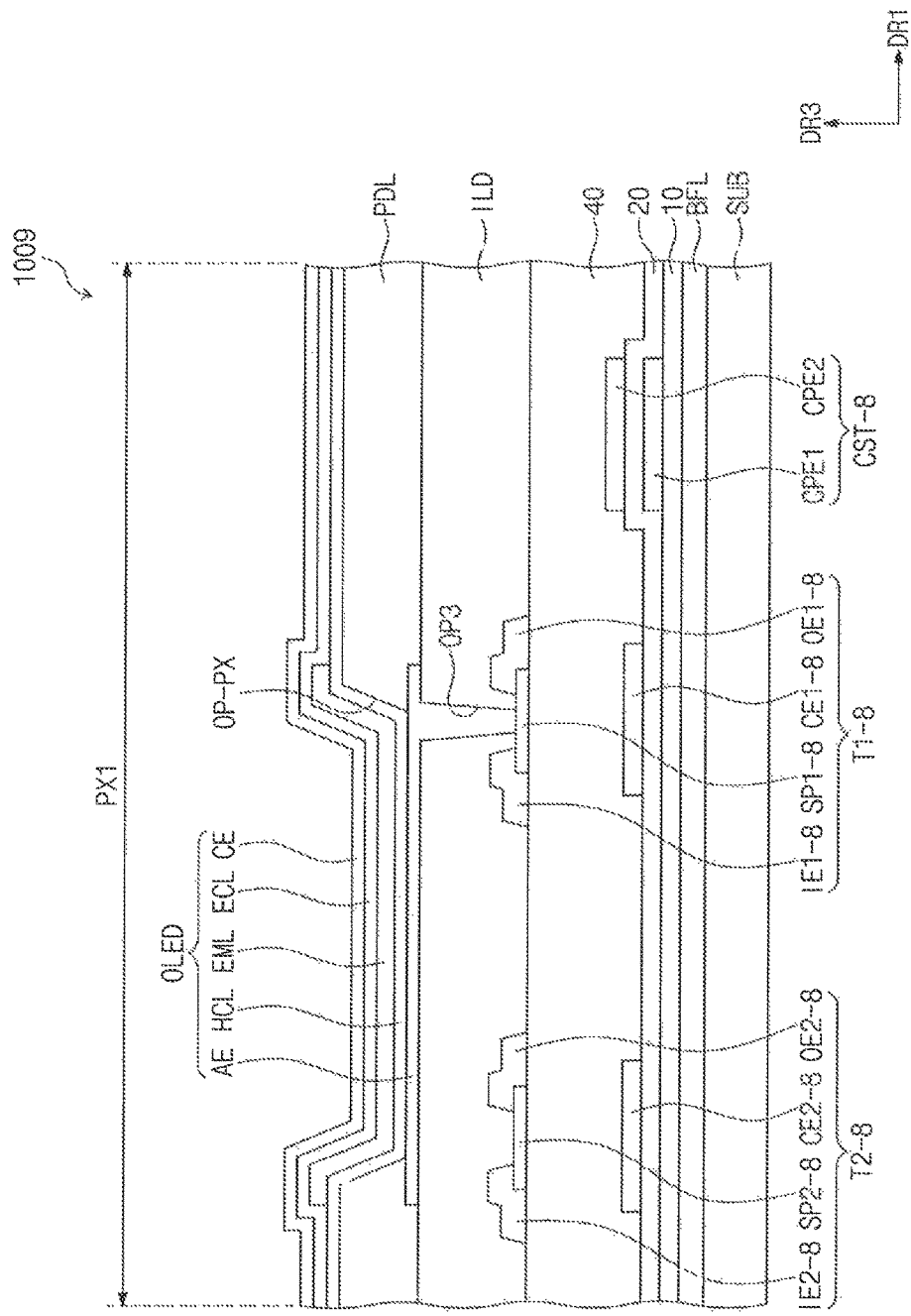
FIG. 13A is a partial cross-sectional view of an organic light emitting display device corresponding to a first pixel of FIG. 1 according to an exemplary embodiment of the present inventive concept.

FIG. 13A is a partial cross-sectional view of an organic light emitting display device 1009 corresponding to the first pixel PX1 of FIG. 1 according to an exemplary embodiment of the present inventive concept. FIG. 13B is a partial cross-sectional view of the organic light emitting display device 1009 corresponding to the second pixel PX2 of FIG. 1 according to an exemplary embodiment of the present inventive concept.

In the organic light emitting display device 1009 to be described with reference to FIGS. 13A and 13B, the folding driving transistor T1-8, the folding control transistor T1-8, the flat driving transistor T3-8, and the flat control transistor T4-8 may all have a bottom-gate structure.

The first pixel PX1 of the organic light emitting display device 1009 includes a folding driving transistor T1-8, a folding control transistor T2-8, a capacitor CST-8, and an organic light emitting diode OLED.

The second pixel PX2 of the organic light emitting display device 1009 includes a flat driving transistor T3-8, a flat control transistor T4-8, a capacitor CST-8, and an organic light emitting diode OLED.

The folding driving transistor T1-8 includes a first control electrode CE1-8, a first semiconductor pattern SP1-8, a first input electrode IE1-8, and a first output electrode OE1-8.

The folding control transistor T2-8 may include a first control electrode CE2-8, a second semiconductor pattern SP2-8, a second input electrode IE2-8, and a second output electrode OE2-8.

The flat driving transistor T3-8 includes a first control electrode CE3-8, a third semiconductor pattern SP3-8, a first input electrode IE3-8, and a first output electrode OE3-8.

The flat control transistor T4-8 may include a second control electrode CE4-8, a fourth semiconductor pattern SP4-8, a second input electrode IE4-8, and a second output electrode OE4-8.

Each of the folding driving transistor T1-8, the folding control transistor T2-8, the flat driving transistor T3-8, and the flat control transistor T4-8 has substantially the same structure as that of the folding driving transistor T1-1 shown in FIG. 6A. Thus, a description thereof may be omitted.

Figure 13B:
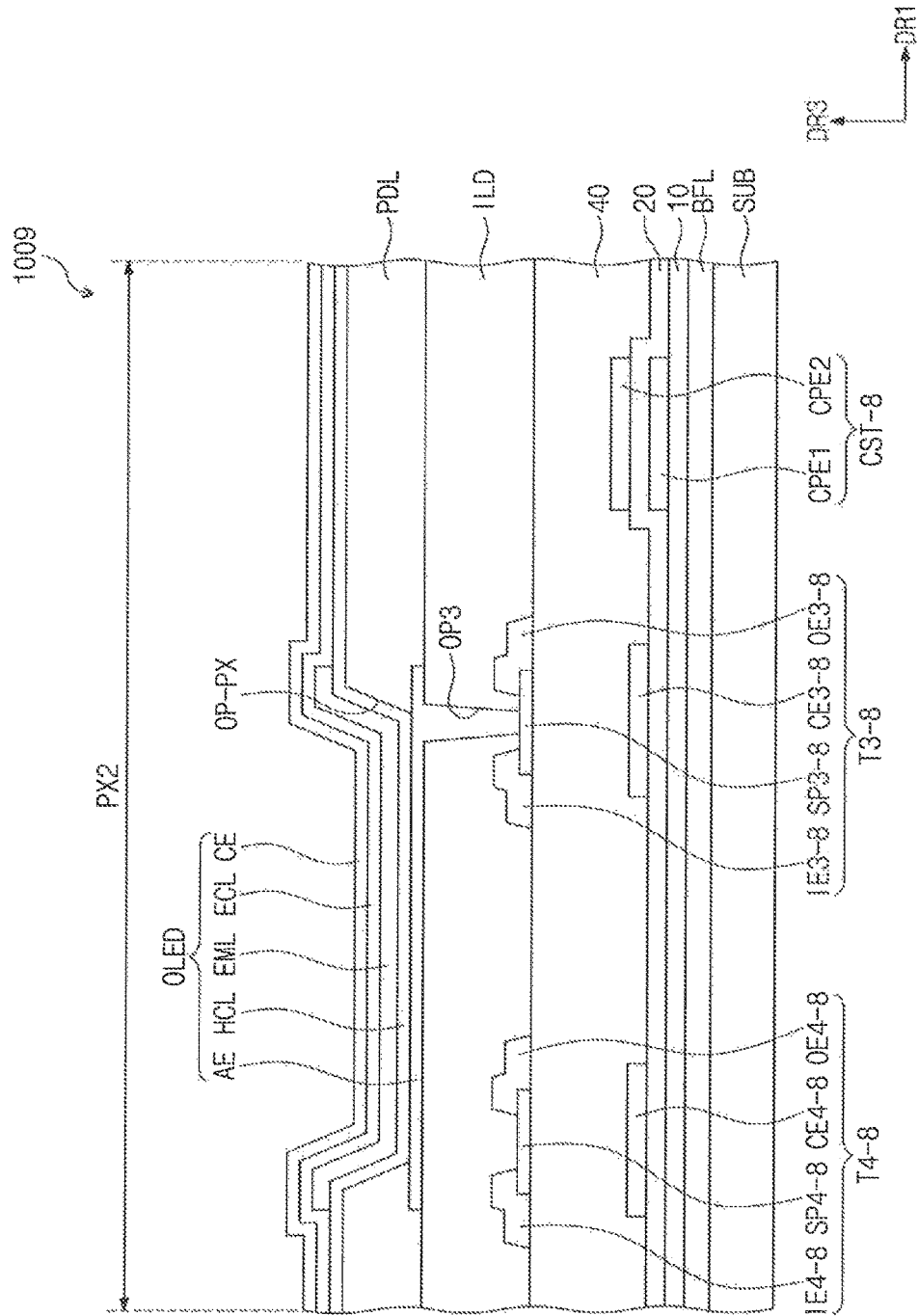
FIG. 13B is a partial cross-sectional view of an organic light emitting display device corresponding to a second pixel of FIG. 1 according to an exemplary embodiment of the present inventive concept.

In the organic light emitting display device 1009 shown in FIGS. 13A and 13B, each of the folding driving transistor T1-8, the folding control transistor T2-8, the flat driving transistor T3-8, and the flat control transistor T4-8 may have a bottom gate structure. The organic light emitting display device 1009 described with reference to FIGS. 13A and 13B may have a similar effect, while including relatively small insulation films, with respect to the organic light emitting display device 1007 described with reference to FIGS. 12A and 12B.

In the organic light emitting display device 1009 to be described with reference to FIGS. 13A and 13B, since the folding driving transistor T1-8, the folding control transistor T2-8, the flat driving transistor T3-8, and the flat control transistor T4-8 have the same structure as each other, the manufacturing process may be relatively simple, and thus, the yield may be increased and the manufacturing cost may be reduced.

According to an organic light emitting display device of the present inventive concept, the deterioration and the occurrence a crack due to the bending of an element disposed at a folding part may be prevented.

While the present inventive concept has been described with reference to exemplary embodiments thereof, it will be understood by those of ordinary skill in the art that various changes in form and details may be made thereto without departing from the spirit and scope of the present inventive concept as defined by the following claims.

What is claimed is:

1. An organic light emitting display device comprising:
a folding part configured to be folded along a folding axis, wherein the folding part includes a first pixel; and
a flat part adjacent to the folding part, wherein the flat part includes a second pixel,
wherein the first pixel comprises a first organic light emitting diode, a first driving transistor and a first control transistor,
wherein the first driving transistor is connected to the first organic light emitting diode and includes a first semiconductor pattern, and
the first control transistor is connected to one of a plurality of scan lines and one of a plurality of data lines and includes a second semiconductor pattern,
the second pixel comprises a second organic light emitting diode, a second driving transistor and a second control transistor,
wherein the second driving transistor is connected to the second organic light emitting diode and includes a third semiconductor pattern, and
the second control transistor is connected to one of the plurality of scan lines and one of the plurality of data lines and includes a fourth semiconductor pattern,
wherein at least one of the first or second semiconductor patterns comprises an oxide semiconductor or a polycrystalline silicon,
the first semiconductor pattern has a bent shape and comprises a first area, a second area and a third area, wherein the second area is a channel area of the first semiconductor pattern, wherein the second area has a length extending along the folding axis and protrudes away from the first area and the third area by a protrusion length, a ratio of the length of the second area to the protrusion length is greater than or equal to 0.3 and
each of the third and fourth semiconductor patterns comprises either the oxide semiconductor or the polycrystalline silicon.

2. The organic light emitting display device of claim 1, wherein the first pixel is provided in plural and the second pixel is provided in plural, and the number of the first pixels is greater than the number of the second pixels.

3. The organic light emitting display device of claim 1, wherein the first driving transistor further comprises a control electrode disposed on the first semiconductor pattern, the first control transistor further comprises a control electrode disposed on the second semiconductor pattern,
the second driving transistor further comprises a control electrode disposed on the third semiconductor pattern, and
the second control transistor further comprises a control electrode disposed on the fourth semiconductor pattern.

4. The organic light emitting display device of claim 1, wherein the first driving transistor further comprises a control electrode disposed below the first semiconductor pattern,
the first control transistor further comprises a control electrode disposed on the second semiconductor pattern,
the second driving transistor further comprises a control electrode disposed on the third semiconductor pattern, and
the second control transistor further comprises a control electrode disposed on the fourth semiconductor pattern.

5. The organic light emitting display device of claim 1, wherein the second semiconductor pattern comprises the oxide semiconductor, and each of the third semiconductor pattern and the fourth semiconductor pattern comprises the polycrystalline silicon.

6. The organic light emitting display device of claim 5, wherein the first driving transistor further comprises a control electrode disposed on the first semiconductor pattern,
the first control transistor further comprises a control electrode disposed on the second semiconductor pattern,
the second driving transistor further comprises a control electrode disposed on the third semiconductor pattern, and
the second control transistor further comprises a control electrode disposed on the fourth semiconductor pattern.

7. The organic light emitting display device of claim 5, wherein the first driving transistor further comprises a control electrode disposed below the first semiconductor pattern,
the first control transistor further comprises a control electrode disposed below the second semiconductor pattern,
the second driving transistor further comprises a control electrode disposed on the third semiconductor pattern, and
the second control transistor further comprises a control electrode disposed on the fourth semiconductor pattern.

8. The organic light emitting display device of claim 1, wherein each of the first semiconductor pattern, the second semiconductor pattern, and the third semiconductor pattern comprises the polycrystalline silicon, and the fourth semiconductor pattern comprises the oxide semiconductor.

9. The organic light emitting display device of claim 8, wherein the first semiconductor pattern is bent in a direction perpendicular to the folding axis on a plane.

10. The organic light emitting display device of claim 9, wherein,
the first area and the third area are spaced apart from each other in a direction parallel to the folding axis,
the second area protrudes away from the first area and the third area by the protrusion length in the direction perpendicular to the folding axis, and
the ratio of the length of the second area to the protrusion length is greater than or equal to 0.3 and less than or equal to 1.

11. The organic light emitting display device of claim 1, wherein each of the first semiconductor pattern and the second semiconductor pattern comprises the polycrystalline silicon, and each of the third semiconductor pattern and the fourth semiconductor pattern comprises the oxide semiconductor.

12. The organic light emitting display device of claim 11, wherein the first semiconductor pattern is bent a direction perpendicular to the folding axis on a plane.

13. The organic light emitting display device of claim 11, wherein the first driving transistor further comprises a control electrode disposed on the first semiconductor pattern,
the first control transistor further comprises a control electrode disposed on the second semiconductor pattern,
the second driving transistor further comprises a control electrode disposed on the third semiconductor pattern, and the second control transistor further comprises a control electrode disposed on the fourth semiconductor pattern.

14. The organic light emitting display device of claim 11, wherein the first driving transistor further comprises a control electrode disposed on the first semiconductor pattern,
the first control transistor further comprises a control electrode disposed on the second semiconductor pattern,
the second driving transistor further comprises a control electrode disposed below the third semiconductor pattern, and
the second control transistor further comprises a control electrode disposed below the fourth semiconductor pattern.

15. The organic light emitting display device of claim 11, wherein the first driving transistor further comprises a control electrode disposed below the first semiconductor pattern,
the first control transistor further comprises a control electrode disposed below the second semiconductor pattern, and
the second driving transistor further comprises a control electrode disposed below the third semiconductor pattern.

16. An organic light emitting display device comprising:
a folding part configured to be folded along a folding axis, wherein the folding part includes a first pixel; and
a flat part adjacent to the folding part, wherein the flat part includes a second pixel,
wherein the first pixel comprises a first organic light emitting diode, a folding driving transistor and a folding control transistor,
wherein the folding driving transistor is connected to the first organic light emitting diode and includes a first semiconductor pattern, and
the folding control transistor is connected to one of a plurality of scan lines and one of a plurality of data lines and includes a second semiconductor pattern,
the second pixel comprises a second organic light emitting diode, a flat driving transistor and a flat control transistor,
wherein the flat driving transistor is connected to the second organic light emitting diode and includes a third semiconductor pattern,
the flat control transistor is connected to one of the plurality of scan lines and one of the plurality of data lines and includes a fourth semiconductor pattern,
the first semiconductor pattern comprises an oxide semiconductor, wherein the first semiconductor pattern has a bent shape and comprises a first area, a second area and a third area, wherein the second area is a channel area of the second semiconductor pattern, and has a length extending along the folding axis and protrudes away from the first area and the third area by a protrusion length, a ratio of the length of the second area to the protrusion length is greater than or equal to 0.3, and
each of the second semiconductor pattern, the third semiconductor pattern and the fourth semiconductor pattern comprises a polycrystalline silicon.

17. An organic light emitting display device comprising:
a folding part configured to be folded along a folding axis, wherein the folding part includes a first pixel; and
a flat part adjacent to the folding part, wherein the flat part includes a second pixel,
wherein the first pixel comprises a first organic light emitting diode, a folding driving transistor and a folding control transistor,
wherein the folding driving transistor is connected to the first organic light emitting diode and includes a first semiconductor pattern, and
the folding control transistor is connected to one of a plurality of scan lines and one of a plurality of data lines and includes a second semiconductor pattern,
the second pixel comprises a second organic light emitting diode, a flat driving transistor and a flat control transistor,
wherein the flat driving transistor is connected to the second organic light emitting diode and includes a third semiconductor pattern, and
the flat control transistor is connected to one of the plurality of scan lines and one of the plurality of data lines and includes a fourth semiconductor pattern;
the fourth semiconductor pattern comprises an oxide semiconductor, and
each of the first semiconductor pattern and the second semiconductor pattern comprises a polycrystalline silicon, wherein the first semiconductor pattern has a bent shape and comprises a first area, a second area and a third area, wherein the second area is a channel area of the first semiconductor pattern, wherein the second area has a length extending along the folding axis and protrudes away from the first area and the third area by a protrusion length, wherein a ratio of the length of the second area to the protrusion length is greater than or equal to 0.3.

18. The organic light emitting display device of claim 17, wherein the first semiconductor pattern is bent in a direction perpendicular to the folding axis on a plane.

* * * * *